(12) United States Patent
Kimura

(10) Patent No.: US 7,479,448 B2
(45) Date of Patent: Jan. 20, 2009

(54) METHOD OF MANUFACTURING A LIGHT EMITTING DEVICE WITH A DOPED ACTIVE LAYER

(75) Inventor: Akitaka Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 429 days.

(21) Appl. No.: 10/537,489

(22) PCT Filed: Dec. 2, 2003

(86) PCT No.: PCT/JP03/15415

§ 371 (c)(1),
(2), (4) Date: Jun. 3, 2005

(87) PCT Pub. No.: WO2004/051759

PCT Pub. Date: Jun. 17, 2004

(65) Prior Publication Data

US 2006/0043356 A1 Mar. 2, 2006

(30) Foreign Application Priority Data

Dec. 3, 2002 (JP) ............................. 2002-351834

(51) Int. Cl.
*H01L 21/20* (2006.01)
(52) U.S. Cl. ........................... 438/604; 257/14; 257/94
(58) Field of Classification Search .................. 257/14, 257/94, 96, 97; 438/604
See application file for complete search history.

(56) References Cited

U.S. PATENT DOCUMENTS

2002/0011599 A1* 1/2002 Motoki et al. ................ 257/76

2002/0189532 A1* 12/2002 Motoki et al. ................ 117/99

FOREIGN PATENT DOCUMENTS

| GB | 2323210 A | 9/1998 |
|---|---|---|
| JP | 8-64869 A | 3/1996 |
| JP | 2000-133884 A | 5/2000 |
| JP | 2000-164925 A | 6/2000 |
| JP | 2000-277868 A | 10/2000 |
| JP | 2001-185758 A | 7/2001 |
| JP | 2002-076522 A | 3/2002 |
| JP | 2002-100838 A | 4/2002 |
| JP | 2002-185085 A | 6/2002 |
| JP | 2002-353144 A | 12/2002 |
| JP | 2003-332244 A | 11/2003 |

* cited by examiner

*Primary Examiner*—Phat X. Cao
*Assistant Examiner*—Abul Kalam
(74) *Attorney, Agent, or Firm*—Sughrue Mion, PLLC

(57) ABSTRACT

Oxygen is doped in a quantum well active layer. First, an n-type $In_{0.02}Ga_{0.98}N$ barrier layer 550 of 10 nm is formed by supplying TMG at 10 sccm, TMI at 30 sccm, $O_2$ at 20 sccm, and $NH_3$ at 10 slm, on the n-type GaN optical guide layer 405. Next, a molar flow rate of TMI is increased to 50 sccm, and an undoped $In_{0.2}Ga_{0.8}N$ well layer 553 of 3 nm is formed. This process is repeated three cycles, and finally, the process is completed with the n-type $In_{0.02}Ga_{0.98}N$ barrier layer 550. A p-type $Al_{0.2}Ga_{0.8}N$ cap layer 407 whose thickness is 20 nm is formed by supplying TMG at 15 sccm, TMA at 5 sccm, and $(EtCp)_2Mg$ at 5 sccm and $NH_3$ at 10 slm, on a multi-quantum well structure active layer 420 formed in this way.

4 Claims, 15 Drawing Sheets

(a)

(b)

SHEET CARRIER CONCENTRATION (cm$^{-2}$)

(a)

(b)

SHEET CARRIER CONCENTRATION ($cm^{-2}$)

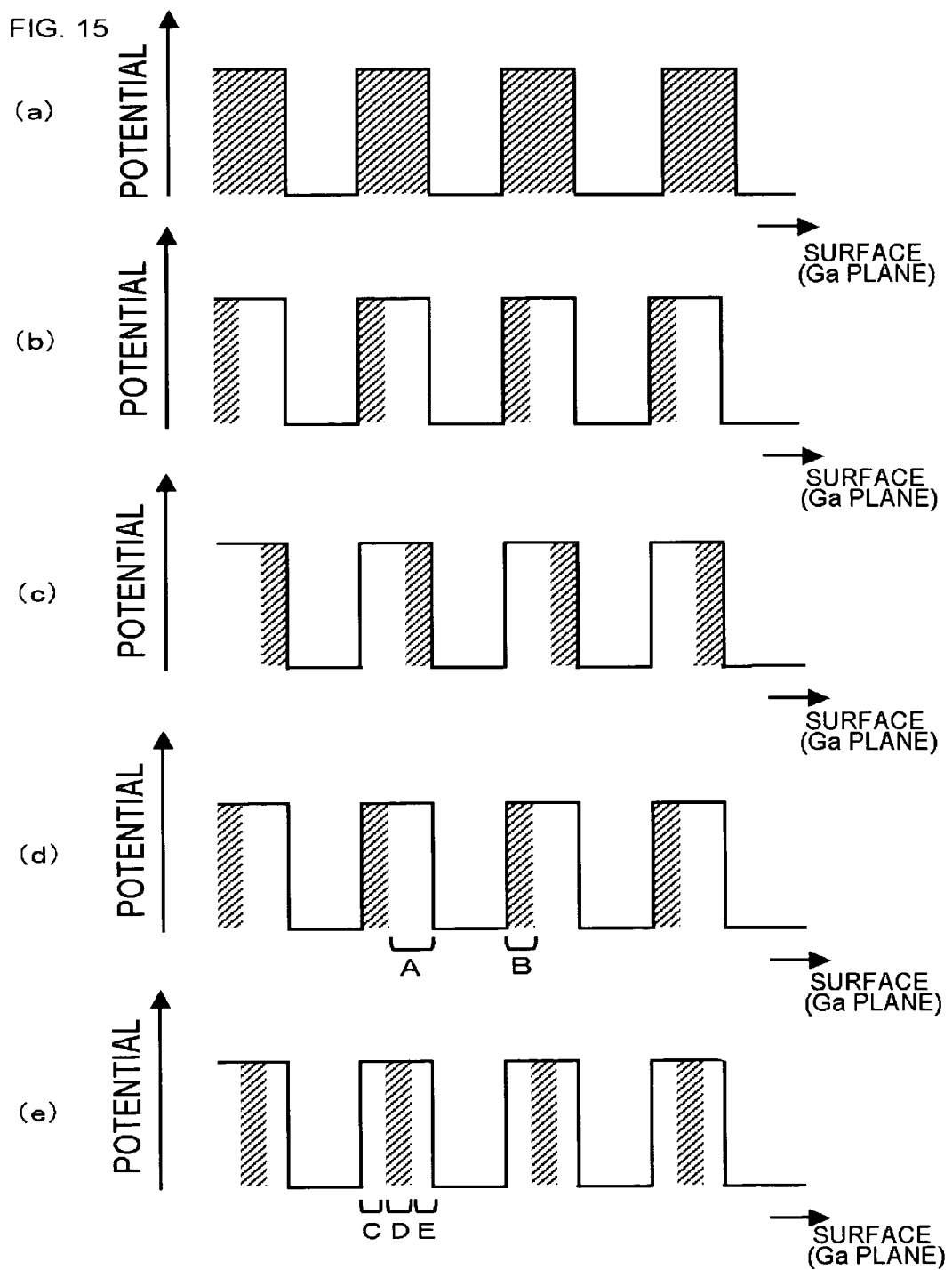

METHOD OF MANUFACTURING A LIGHT EMITTING DEVICE WITH A DOPED ACTIVE LAYER

FIELD OF THE INVENTION

The present invention relates to a semiconductor device having a quantum well structure and a manufacturing method thereof.

DESCRIPTION OF THE RELATED ART

In Group III nitride semiconductor optical devices, there has been broadly used a technology that allows an active layer to be a quantum well structure in which barrier layers and well layers are alternately laminated. A high-powered device can be realized by using the quantum well structure.

Usually, silicon is doped in barrier layers of such a quantum well structure. However, in some documents, it is suggested that impurities other than silicon are introduced.

In Laid-open patent publication No. 2001-185758 (Patent document 1), there is described a technology in which two types of elements are used as donor impurities. Concretely, there is described a technology in which a Group 2 element is used as an acceptor element, and carbon (C), silicon (Si), germanium (Ge), tin (Sn), and lead (Pb) of the Group 4 elements are used as donor impurities. Further, it is described that, in a case where the Group 4 elements are used as acceptor impurities, sulfur (S), selenium (Se), and tellurium (Te) of the Group 6B elements can be used as donor impurities.

In Laid-open patent publication No. 2002-185085 (Patent document 2), Si, Ge, O, C, Zn, Be, and Mg are illustrated as impurities to be introduced in well layers or barrier layers of a multi-quantum well structure.

As described above, some publications suggest the possibility that impurities other than silicon are introduced in barrier layers of a quantum well structure. However, these publications do not describe the fact that impurities, such as oxygen, sulfur, and the like, other than silicon were actually introduced in semiconductor layers of a quantum well structure, nor report that the characteristics of a device have been improved by introducing these impurities in a quantum well. Currently, as the impurities to be introduced in quantum well barrier layers, only silicon is virtually used. The reasons will be described hereinafter.

The first reason thereof is because, in a case of carrying out doping of impurities other than silicon, it is difficult to introduce those at a desired concentration. Although the reason is not clear, it is speculated as one of the factors that a vapor pressure of a compound generated by a reaction between an impurity element, such as oxygen or the like, other than silicon and a Group III element shows a higher value as compared with a vapor pressure of a compound generated by a reaction between silicon and a Group III element.

The second reason is because it has been thought that the carrier generation efficiencies of the other impurities are inferior to that of silicon. Actually, the carrier generation efficiencies of impurities such as oxygen and the like are lower than that of silicon.

The third reason is because it has been thought that, taking into consideration a process of forming an optical device structure, doping of impurities other than silicon is disadvantageous. Describing a structure of a semiconductor laser as an example, the structure is a structure in which, for example, an n-type cladding layer and an active layer are laminated in this order on a substrate. In a process of forming this structure, it is reasonable that the active layer is formed by using the same impurity after forming the n-type cladding layer. For forming the n-type cladding layer, silicon which is excellent in impurity introduction efficiency and carrier generation efficiency, and which has a past record of use is used. Accordingly, when the active layer thereon is formed, it is still the case that the impurity same as that of the cladding layer is used from the standpoint of the efficiency of the process.

For the above-described reasons, introduction of impurities other than silicon in barrier layers of a quantum well structure, and application of the quantum well on which impurities other than silicon have been introduced to a device have not virtually been carried out. Although the above-described publications suggest a possibility of introducing impurities other than silicon, those are merely abstract descriptions, and there is no concrete disclosure. In particular, there is no concrete description of how to fabricate a semiconductor layer structure and a device in which impurities other than silicon have been introduced so as to be able to exhibit original functions.

On the other hand, light emitting diodes in which oxygen has been doped in a light emitting layer are described in Patent documents 3 and 4. However, in the oxygen doping methods described in these publications, it is difficult to uniformly dope oxygen in a light emitting layer, and it has not been able to prevent oxygen from being ununiformly distributed in the light emitting layer in accordance with a level of In concentration, generation of dislocations at the interface between layers whose compositions are different from one another, and the like. There are no descriptions of a method for uniformly doping oxygen in a light emitting layer while eliminating the effect of such a factor in these patent documents. As will be described later, in a case of using a light emitting layer of a quantum well structure, a special engineering practice is required in order to uniformly dope oxygen in well layers and barrier layers. However, such a producing method is not described in the above-described patent documents.

There is a description suggesting the following facts in paragraph 0022 of Patent document 3.

(i) At the interface of InGaN layers whose In concentrations are different from one another, oxygen atoms are easily intensively captured due to generation of a misfit dislocation or the like.

(ii) The InGaN layers have a multiphase structure composed of a main phase, whose In concentration is low and a dependent phase whose In concentration is high. Oxygen is easily taken into a dependent phase whose In concentration is high.

Accordingly, if the oxygen doping method described in the Patent document is applied to an MQW composed of $In_{0.1}Ga_{0.9}N$ well layers and GaN barrier layers, it can be thought that oxygen atoms are intensively captured at the interface, and oxygen is distributed at a high concentration in an In high-concentration region.

On the other hand, in Patent document 4, a structure is described in which a band structure in which a conduction band and a valence band bend to the side of low potential is formed in a terminating well layer, and oxygen is doped in the terminating well layer. As the effect corresponding to the structure, there is described "the effect of increasing a luminous intensity from a terminating well layer is provided." in paragraph 0063. However, there is no direct description of a structure in which oxygen is doped in a light emitting layer of a quantum well structure, and further, there is no description of a method for preparing a light emitting layer of a quantum well structure on which oxygen has been uniformly doped.

Further, the concrete structures described in these publications are limited to light emitting diodes using heterogeneous substrates such as sapphire and the like, and there are no descriptions of carrying out oxygen doping in a light emitting layer in a case of using a low dislocation substrate, and the effect thereof.

Patent document 1 Laid-open patent publication NO. 2001-185758

Patent document 2 Laid-open patent publication NO. 2002-185085 (Paragraph 0016)

Patent document 3 Laid-open patent publication NO. 2000-164925

Patent document 4 Laid-open patent publication NO. 2000-133884

SUMMARY OF THE INVENTION

The present invention has been achieved in consideration of the above-described circumstances, and an object of the invention is to improve the performance such as a luminous efficiency and the like while maintaining the crystallization of semiconductor layers constituting a quantum well structure.

According to the present invention, there is provided a semiconductor light emitting device comprising: a substrate; and a light emitting layer, which is provided on the substrate, of a quantum well structure including well layers and barrier layers which are composed of Group III nitride semiconductors, wherein an impurity composed of an element in Periodic Table Group 6B is substantially uniformly doped in the well layers and the barrier layers.

As described in the paragraph of the conventional art, it is difficult to uniformly dope the elements in Periodic Table Group 6B, such as oxygen and sulfur, in the well layers and the barrier layers by a normal doping technique. It is hard to introduce oxygen and the like into Group III nitride semiconductors, and in particular, it is extremely difficult to introduce it at a desired concentration with a high controllability. Further, it is extremely difficult to distribute oxygen and the like uniformly in the quantum well structure, in particular, in a quantum well structure including In. This may be speculated to be attributed to the fact that impurities such as oxygen and the like have the character of easily concentrating at an interface between two layers whose In concentrations are different from one another, or at defects in a crystal.

To address this problem, the inventors succeeded in stably obtaining a light emitting layer on which an impurity such as oxygen or the like has been substantially uniformly doped by a method for excessively supplying oxygen while maintaining a growth temperature at a high temperature to some extent, which resulted in the completion of the present invention.

When silicon is used as an impurity of a quantum well, there are cases in which the silicon has a harmful influence on the quality of a layer directly thereon, and in order to suppress the influence, it is necessary to precisely control a silicon concentration distribution in the quantum well. In contrast thereto, because the elements in Periodic Table Group 6B are used as impurities in the present invention, the harmful influence on the growth of layer is suppressed, and accurate control of concentration distribution and the like are made unnecessary. The reason for this is that, when a well layer is formed on a barrier layer on which doping has been carried out, there are cases in which point defects are increased in the well layer and the interface between the well layer and the barrier layer is made disordered, and in contrast thereto, there are little such adverse effects in the case of the elements in Periodic Table Group 6B, in particular, O, S, and Se. Further, it can be thought of one reason that, because the elements in Periodic Table 4B such as silicon, germanium, tin, and lead substitute a Group III element and forcibly get into the Group III site, a distortion is easily included in a crystal, and in contrast thereto, because the element in Periodic Table Group 6B is introduced into a semiconductor layer so as to fill up nitrogen vacancies easily generated in a nitride semiconductor, defects which must be generated in a case of undoping can be further reduced.

Further, according to the present invention, because a Group 6B element impurity has been substantially uniformly doped in the light emitting layer, the luminescence characteristic can be stably improved. The reason is, although not necessarily clear, but speculated as follows.

The first reason is because the effect of filling up nitrogen vacancies or the like can be obtained over the well layers and the barrier layers. Such an effect is exhibited at only some places in a case of ununiform-doping. However, in a case of uniform-doping, the nitrogen vacancies can be filled up in the well layer and the barrier layer, and the crystalline quality of the light emitting layer can be improved.

The second reason is because a carrier having a necessary concentration can be stably generated. Because the Group 6B element impurities such as oxygen or the like have low carrier generation efficiencies, it is difficult to sufficiently generate carriers for obtaining satisfactory luminescence characteristics. It is necessary to introduce oxygen at a high concentration in order to generate a sufficient amount of carriers. However, as described above, impurities such as oxygen and the like are likely to be ununiformly distributed in general. Therefore, when an attempt is made to introduce an impurity at a high concentration, the problem that a region into which an impurity with an extremely high concentration is introduced is locally generated, and the crystalline quality deteriorates at the region is brought about. In uniform-doping, such a problem can be solved, and a sufficient amount of impurity can be introduced while suppressing the deterioration in the crystalline quality.

As described above, the effect of improving the luminescence characteristic by uniform-doping can be obtained.

In the present invention, the Group 6B element impurity is substantially uniformly doped in the light emitting layer. The substantial uniformity means that a maximum concentration is less than or equal to five times as high as a minimum concentration. An impurity concentration can be detected by SIMS (secondary ion mass spectrometry). Note that the impurity concentration here is in a resolution which can be analyzed by a SIMS measurement, and can be judged on the basis of, for example, the results obtained by measuring an average impurity concentration at every about 1 nm in a laminating direction of the light emitting layer.

Note that, in the present invention, the impurity composed of an element in Periodic Table Group 6B is uniformly doped in a region composed of the well layers and the barrier layers. This impurity is preferably distributed uniformly over the entire light-emitting region. Namely, the state is preferably made such that the impurity is substantially uniformly distributed on the respective portions of the well layers, and the impurity is substantially uniformly distributed on the respective portions of the barrier layer. Note that the above-described region may be the entire light emitting layer, or may be a part of the light emitting layer. For example, the above-described impurity may not be introduced in the portion at the substrate side of the light emitting layer, and the above-described impurity may be uniformly distributed on the upper portion thereof. The above-described impurity may be uniformly distributed on all the well layers and the barrier layers constituting the light emitting layer.

Further, according to the present invention, there is provided a semiconductor light emitting device comprising: a Group III nitride semiconductor substrate whose surface dislocation density is less than $1 \times 10^8$ cm$^{-2}$; and a light emitting layer, which is provided thereon, of a quantum well structure including well layers and barrier layers which are composed of Group III nitride semiconductors, wherein the light emitting layer includes elements in Periodic Table Group 6B as impurities.

Generally, in Group III nitride semiconductors, it has been well known that nitrogen vacancies are easily generated in crystals because the vapor pressure of nitrogen is high, and because the efficiency in disassembling NH$_3$ which is a general Group V precursor is low. When many nitrogen vacancies are generated in a crystal, the quality of the crystal deteriorates. The Group 6B elements get into such nitrogen vacancies, which can contribute to the improvement in the crystalline quality.

By the way, when a Group III nitride semiconductor crystal is made to grow on a heterogeneous material substrate such as sapphire or the like, a large number of dislocations are introduced into the crystal so as to be taken over from the interface between the substrate and the semiconductor layers due to a difference between the lattice constants of the substrate and the semiconductor layers, and the like. In this case, the defects in the crystal due to nitrogen vacancies are made enough to be ignored relatively. Accordingly, the function of the Group 6B element which improves the crystalline quality by filling up the nitrogen vacancies does not appear remarkably in the growth on the heterogeneous material substrate.

On the other hand, when a Group III nitride semiconductor crystal is made to grow on a low dislocation substrate such as a Group III nitride semiconductor substrate, dislocations in the crystal taken over from the interface with the subst are relatively little, and the ratio for which defects due to nitrogen vacancies account are made relatively large. In this case, the function of the Group 6B element which improves the crystalline quality by filling up the nitrogen vacancies is made remarkable.

Namely, in a layer structure in which crystals have been made to grow on a low dislocation substrate such as a Group III nitride semiconductor substrate, the crystalline quality can be improved by the synergism between the low dislocation substrate and the function of the Group 6B element, and it is possible to stably realize a satisfactory luminous efficiency.

The above-described semiconductor light emitting device may be fabricated such that semiconductor layers including elements in Periodic Table Group 4B is provided between the substrate and the light emitting layer. Further, this semiconductor layer may be provided so as to contact the light emitting layer. The layers lower than the light emitting layer mean n-type semiconductor layers, for example, an n-type cladding layer and the like. In the doping in semiconductor layers other than a light emitting layer of a quantum well structure, there is relatively little influence on the quality of the semiconductor layers in accordance with a type of impurity. Accordingly, in doping in these layers, it is preferable to select carriers whose introduction efficiencies and carrier generation efficiencies are high. From such a standpoint, as the layers under the light emitting layer in the above-described structure, an element in Periodic Table Group 4B excellent in the point of an introduction efficiency has been selected. As an example of such a layer structure, a structure in which a quantum well active layer on which oxygen has been doped is formed on an n-type cladding layer on which silicon has been doped can be illustrated.

Moreover, according to the present invention, there is provided a method of manufacturing a semiconductor light emitting device comprising a step of forming a light emtitting layer composed of a Group III nitride semiconductor on a substrate by a vapor phase deposition method by using a doping gas containing an element in Periodic Table Group 6B, and a mixed gas including a Group III precursor gas and a nitrogen source gas, wherein a molar flow rate of the doping gas is made excessive more than a molar flow rate of the Group III precursor gas.

Conventionally, doping of elements in Periodic Table Group 6B as impurities has not been usually carried out. This is because, when elements in Periodic Table Group 6B are used as impurities, the doping eccifiencies are low, and it is difficult to exhibit desired performances. In the present invention, in order to solve such a problem, a molar flow rate of a doping gas is made excessive more than a molar flow rate of a Group III precursor gas. Namely, a molar flow rate of a doping gas is made excessive more than a molar flow rate of a Group III precursor gas. In accordance therewith, it is possible to stably dope an effective amount of elements in Periodic Table Group 6B into the Group III nitride semiconductor layer.

In the above-described manufacturing method, after a Group III nitride semiconductor layer containing an element in Periodic Table Group 4B as impurities is formed on the substrate by a vapor phase deposition method, the process of forming a light emitting layer may be executed. In this way, when different types of impurities are respectively doped in a plurality of semiconductor layers, a step of switching impurity gases is required in the process of semiconductor layer growth. It is important to suppress unexpected generation of compounds in this process. In particular, when switching from a film forming process by using silicon as an impurity to a film forming process by using oxygen as an impurity is required as described above, a concern that silicon oxide film is deposited is brought about.

As a countermeasure against such a concern, in the above-described manufacturing method, it may be fabricated such that, after a Group III nitride semiconductor layer containing an impurity getting into a Group III element site has been formed, a film-forming gas is purged, and then, a light emitting layer is formed. In this way, the problem at the step of switching impurity gases can be solved.

In the present invention, the elements in Periodic Table Group 6B and the elements in Periodic Table Group 4B can be used as n-type impurities.

In the present invention, the light emitting layer can be made to be a quantum well structured layer. In this case, it is constituted such that the step of forming the light emitting layer includes a step of alternately forming well layers and barrier layers, and a doping gas is introduced at the time of forming the barrier layers. The quantum well may be a single well and multiple wells. The case of applying the present invention to such a light emitting layer is effective because a luminous efficiency can be improved while suppressing the deterioration in the crystalline quality in the quantum well. Here, the barrier layers constituting the quantum well are positioned above and under a well layer so as to sandwitch it, and mean layers whose band gaps are larger than those of well layers. In a case of a single quantum well structure as well, the both upper and lower layers which sandwich a well layer are defined as barrier layers.

In the present invention, as the elements in Periodic Table Group 6B, O, S, Se, and Te can be illustrated. On the other hand, Si, Ge, Sn, or the like can be sampled as the elements in Periodic Table Group 4B.

In the present invention, the light emitting layer means a layer in which carriers recombine radiatively. However, in a case of a device in which carriers are made to recombine radiatively at the quantum well layers, the entire single or multi-quantum well structure including well layers and barrier layers is defined as a light emitting layer. Note that, when the device is a laser, a light emitting layer is called an active layer.

The quantum well structure relating to the present invention can be applied to a light emitting device such as a semiconductor laser, a light emitting diode, or the like, a light receiving device such as a solar battery, an optical sensor, or the like, a modulator or the like, and further, can be applied to an electronic device such as an FET (field effect transistor) or the like as well. Concretely, when the quantum well structure is applied to an active layer, an optical waveguide layer, or the like of a light emitting device, an excellent luminous efficiency can be realized. On the other hand, because there are extremely many defects in a GaN system semiconductor at the time of growing n-type GaN in an electronic device, in order to obtain great mobility, it is necessary to add a large quantity of n-type impurities. At that time, as shown in the present invention, by carrying out doping of the n-type impurities in only the lower layer portion of the n-type layer, and thereafter, by growing an undoped layer, a high-quality n-type semiconductor layer can be obtained without deteriorating the crystallization of a layer further growing on the upper layer. Note that the laminating direction in the present invention means a direction in which semiconductor layers are going to be laminated on the substrate.

According to the present invention, because a quantum well structure including the elements in Periodic Table Group 6B is used, the crystallization of the semiconductor layers constituting the quantum well structure is satisfactorily maintained, and a semiconductor light emitting device which is excellent in a radiation lifetime and a luminous efficiency can be realized.

BRIEF DESCRIPTION OF THE DRAWINGS

The objects described above, and other objects, features, and advantages will be more obvious from preferred embodiments which will be described hereinafter, and with reference to the accompanying drawings.

FIG. 15 is diagrams for explanation of doping profiles of the Group III-V nitride semiconductor laser described in the reference examples.

DETAILED DESCRIPTION OF THE INVENTION

Figure 1:
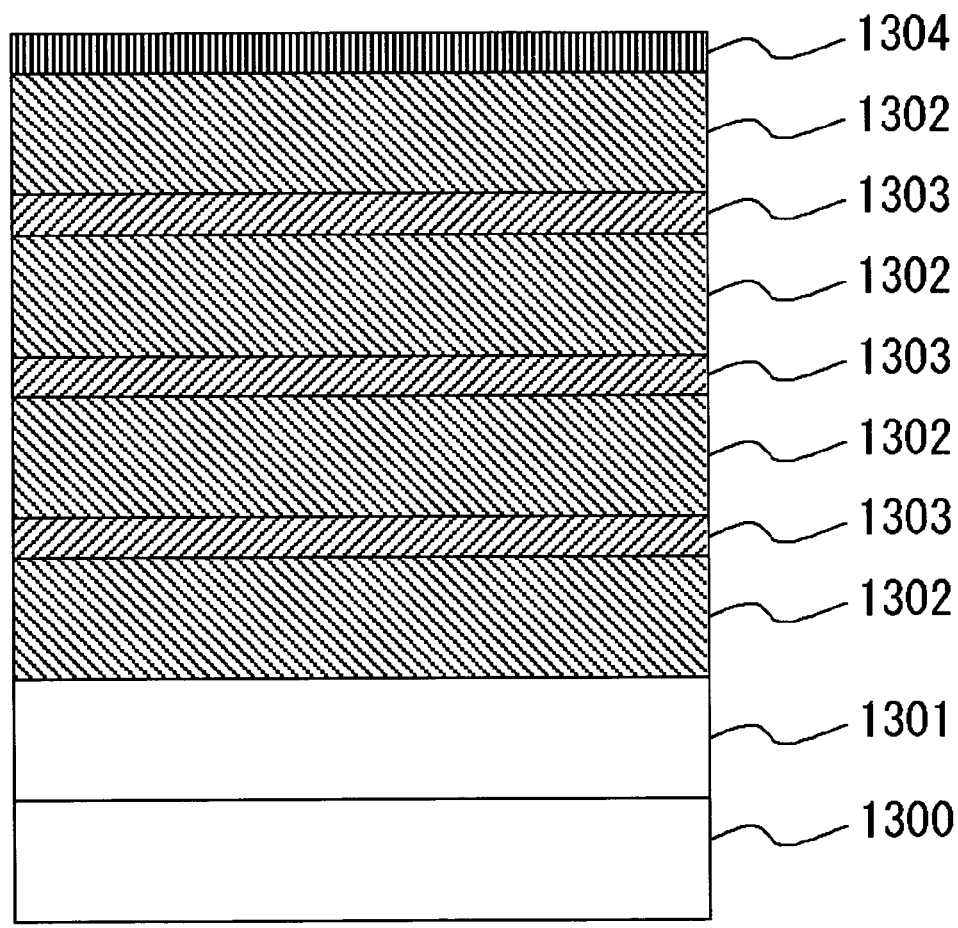
FIG. 1 is a diagram showing a layer structure of a sample used in an example 1 and an example 5.

Hereinafter, a concrete structure of the present invention will be described with reference to the drawings. Note that, in all the drawings, same components are denoted by the same reference numerals, and descriptions thereof will be appropriately omitted.

In a quantum well structure used in the present invention, elements in Periodic Table Group 6B are introduced in at least a part of a light emitting layer. In this quantum well structure, it is preferably constituted such that a barrier layer includes an element in Periodic Table Group 6B, and includes an n-type conductive part. A well layer may include an element in Periodic Table Group 6B.

As the elements in Periodic Table Group 6B, elements of O, S, Se, Te, and the like are illustrated. O, S, and Se thereamong can stably generate carriers, and are preferable. O and S are preferable because the handling thereof are easy. In particular, when O is introduced in a quantum well structure, as will be described in examples, a PL (photo luminescence) characteristic can be remarkably improved.

When an impurity is O, as a doping gas, $O_2$, $H_2O_2$, $H_2O$, or a mixed gas of those and an inert gas or the like can be used. Further, when an impurity is S, as a doping gas, $H_2S$ or a mixed gas of those and an $H_2$ gas or the like can be used. Moreover, when an impurity is Se, as a doping gas, $H_2Se$ or a mixed gas of those and an $H_2$ gas or the like can be used a doping gas.

An amount of introducing an impurity into the quantum well structure is preferred to be an amount enough to generate carriers at an effective concentration after being introduced in semiconductor layers constituting the quantum well, which contributes to the improvement in the device characteristics. Here, when an impurity is introduced into the multi-quantum well, in order to make a study of the effect on the improvement in the device characteristics, it is appropriate to discuss on the basis of a sheet concentration per quantum well. For example, given that a number of wells is 3, the thicknesses of the barrier layers and the well layers are respectively 7 nm (the thickness of the entire quantum well structure is 49 nm), and an average impurity concentration of the entire quantum well is $x cm^{-3}$, a sheet concentration per quantum well is $x \times 49 \times 10^{-7}/3 = 16 \times 10^{-7} \times x$ $(cm^{-2})$.

According to the study by the inventors and others, it was confirmed that, given that a sheet concentration of an impurity per quantum well, i.e., a thickness of a light emitting layer is d (nm), an average volume concentration in the light emitting layer of an element in Periodic Table Group 6B is x (cm$^{-3}$), and a number of quantum wells is n, if an impurity concentration defined by xd×10$^{-7}$/n is greater than or equal to 3×10$^{11}$ cm$^{-2}$, the effect on the improvement appears in the characteristics of the light emitting device.

Next, a suitable carrier concentration will be described. The inventors and others contrasted a SIMS analysis and a hole measurement and studied them, and, in a case of oxygen, the data that the carrier concentration is 1/20 times as high as an element concentration was obtained. This relationship is substantially established with respect to the Group 6B elements other than oxygen as well. This is because a depth from the conduction band at an energy level generated when a Group 6B element other than oxygen is introduced in the Group III nitride semiconductor is substantially the same value in oxygen and the other Group 6B element.

When this relationship is used, in order to improve the characteristics of the light emitting device, the carrier concentration is preferred to be greater than or equal to 3×10$^{11}$ cm$^{-2}$×(1/20)=1.5×10$^{10}$ cm$^{-2}$.

Suitable impurity concentration and carrier concentration for improving the characteristics of a light emitting device were described above. Next, a range of a concentration per quantum well at which the effect on improving a PL (photo luminescence) characteristic especially among the characteristics of the light emitting device can be stably obtained will be described. As will be described in example 1 and FIGS. 4 to 5, in an InGaN quantum well of the Group III nitride semiconductor light emitting device, the carrier concentration is preferably made greater than or equal to 0.3×10$^{12}$ cm$^{-2}$, and is more preferably made greater than or equal to 0.6×10$^{12}$ cm$^{-2}$. To convert into an element concentration of the impurity, those are increased twenty-fold to be greater than or equal to 0.6×10$^{13}$ cm$^{-2}$, and to be preferably greater than or equal to 1.3×10$^{13}$ cm$^{-2}$. With the carrier concentration and the impurity concentration being set in this way, a satisfactory PL characteristic can be obtained.

On the other hand, the effect on the improvement in the PL characteristic to a given extent can be recognized even when an introduction amount of the impurity is large, and there is no limitation to the upper limit of a doping amount in that sense. However, in a case of an excessive doping amount, there are cases in which the instability in various characteristics of a device is brought about due to the deterioration in the crystalline quality. From the standpoint thereof, it is preferable that the carrier concentration is made less than or equal to 7×10$^{12}$ cm$^{-2}$, and the impurity concentration is made less than or equal to 14×10$^{13}$ cm$^{-2}$.

A suitable doping amount was described with the example of oxygen. However, it is applicable to the Group 6B elements such as S, Se, and Te other than oxygen in the same way. This is because the quantitative relationship between the impurity element concentration and the carrier concentration generated from the impurity strongly depends on a donor level of the impurity in the semiconductor layers, and the donor levels of the above-described elements are values which are substantially the same level.

As an underneath substrate for forming a quantum well structure thereon, various substrates can be used. For example, a Group III nitride semiconductor substrate such as GaN, AlGaN, or the like, a heterogeneous material substrate such as sapphire, SiC, MgAl$_2$O$_4$, or the like can be used. When a Group III nitride semiconductor substrate among those is used, the effect on the improvement in the luminous efficiency is even more remarkable due to the synergistic effect with the above-described impurity introduction. This point will be described hereinafter.

Generally, it has been well known that, in a Group III nitride semiconductor, because the vapor pressure of nitrogen is high, and because the efficiency in disassembling NH$_3$ which is a general Group V precursor is low, nitrogen vacancies are easily generated in crystals. When a large number of nitrogen vacancies are generated in crystals, the quality of crystal deteriorates. The Group 6B elements get into such nitrogen vacancies, which can contribute to the improvement in the crystalline quality.

By the way, when a Group III nitride semiconductor crystal is made to grow on a heterogeneous material substrate such as sapphire or the like, a large number of dislocations are introduced in the crystal so as to be taken over from the interface between the substrate and the semiconductor layers due to a difference between the lattice constants of the substrate and the semiconductor layers, and the like. In this case, the crystal defects due to the nitrogen vacancies are enough to be able to be ignored relatively. Accordingly, the function of the Group 6B element which improves the crystalline quality by filling up the nitrogen vacancies does not appear remarkably in the growth on the heterogeneous material substrate.

On the other hand, when a Group III nitride semiconductor crystal is made to grow on a low dislocation substrate such as a Group III nitride semiconductor substrate, dislocations taken over from the interface with the substrate are relatively little, and the ratio for which defects due to nitrogen vacancies account is made relatively large. In this case, the function of the Group 6B element which improves the crystalline quality by filling up the nitrogen vacancies is made remarkable.

Namely, in a layer structure in which a crystal has been made to grow on a low dislocation substrate such as a Group III nitride semiconductor substrate, the crystalline quality can be improved by the synergistic effect between the low dislocation substrate and the Group 6B element, and it is possible to stably realize a satisfactory luminous efficiency.

From the above-described standpoint, a surface dislocation density of the Group III nitride semiconductor substrate is made less than or equal to 10$^8$/cm$^2$, and is preferably made less than or equal to 10$^7$/cm$^2$. Such a low dislocation substrate can be obtained by, for example, a FIELO (Facet-Initiated Epitaxial Lateral Overgrowth), a Pendeo-Epitaxy growth, or the like.

(FIELO Method)

A thin GaN is formed on a substrate such as sapphire or the like, and a stripe-formed SiO$_2$ mask is formed thereon. By growing the GaN selectively in a lateral direction at the opening portion of the mask, a GaN layer whose surface dislocation density is low is obtained. This is because the dislocation is not only blocked by the SiO$_2$ mask, but also curved in the horizontal direction of the substrate at the time of selective lateral growth. This method is described in "OYO BUTURI, Volume 68, Number 7 (1999), pp. 774-779" and the like.

(Pendeo-Epitaxy Method)

After a low temperature buffer layer is formed on a substrate, a GaN layer composed of a single crystal is formed. Next, a pattern of GaN extended in a stripe form is formed by carrying out selective etching by using masks. By growing a crystal from the top plane or the side surface of the GaN stripe, a front-end layer whose surface dislocation density is low can be formed. The Pendeo-Epitaxy method is described in, for example, "Tsvetankas. Zhelevaet. Al.; MRSInternet J. Nitride Semicond. Res. 4SI, G3.38 (1999)" and the like.

Note that the surface dislocation density of the Group III nitride semiconductor substrate can be measured by a well-known method such as a method for measuring an etch pit density, a method of a cross-sectional TEM observation, or the like.

"Group III nitride semiconductor" in the present invention is effective in a case of a gallium nitride-based semiconductor expressed by a general expression $In_xAl_yGaN$ ($0 \leq x \leq 1$, $0 \leq y \leq 1$). Further, the Group III nitride semiconductor layer is even more effective in the case of having an wurtzite crystal structure. In the case of using such a material, because a large piezoelectric field is generated in the active layer, and the influence of the piezoelectric field is made remarkable, the effect on suppressing a piezoelectric field according to the present invention is even more remarkably exhibited.

The quantum well structure relating to the present invention is constituted such that well layers and barrier layers composed of Group III nitride semiconductors are alternately laminated in the crystal orientation expressed by [x, y, −(x+y), z] (x, y are arbitrary integers, and z is a natural number). For example, it can be made to be a Group III nitride semiconductor layer having a wurtzite crystalline structure, and can be made to be a semiconductor layer in which a crystal growth axis has a positive component in the c axis direction, i.e., [0001] direction. As such a semiconductor layer, for example, by using a gallium nitride-based semiconductor as an example, a semiconductor layer with (1-101) plane, (11-21) plane, or the like being the growth planes is illustrated.

The difference between such crystal growth planes can be specified by evaluating, for example, from what element the uppermost surface is formed. When $In_xAl_yGa_{1-x-y}N$ ($0 \leq x \leq 1$, $0 \leq y \leq 1$) is selected as a semiconductor material, and the c plane, i.e., the (0001) plane is regarded as a crystal growth plane, the uppermost surface is a Ga plane (c plane). In order to verify what plane the uppermost surface is, an X-ray analysis is effective. However, it can be simply verified by wet-etching the surface with a predetermined chemical. For example, in a case of a gallium nitride-based semiconductor, it has been known that an etching agent such as potassium hydroxide etches onto only a plane of N polarity, and by using this, it can be easily judged whether the uppermost surface is a Ga plane (c plane) or an N plane (−c plane).

In order to prepare a semiconductor having a crystal growth plane provided in the present invention, it is important to appropriately select a crystal growth substrate, a crystal growth plane of the substrate, the conditions for growing a semiconductor layer, or the like. Further, it is important to carry out cleaning of the substrate surface under appropriate conditions, and in order to grow a semiconductor layer with the c plane, i.e., the (0001) plane being a crystal growth plane, for example, on a sapphire c plane, it is effective that heat treatment is applied onto the substrate surface under the hydrogen atmosphere and predetermined conditions.

The present invention is even more effective in a case of being applied to a structure in which the well layers include In. It has been known that In easily brings about phase separation in an active layer. Therefore, when a piezoelectric field is generated in the quantum well, there are cases in which a phenomenon such that an lasing wavelength becomes multi-wavelengths with ununiformity of composition by the phase separation of In and the piezoelectric field affecting to each other, or the distribution of the light emitting wavelengths is varied in accordance with an injection current is brought about. According to the present invention, such a phenomenon can be effectively suppressed, and the original characteristic of the quantum well active layer including In can be exhibited.

The light emitting layer of the quantum well structure in the present invention on which oxygen is uniformly doped can be formed, for example, by using the following conditions, and by adjusting the manufacturing conditions appropriately.

(i) Substrate temperature: 650 to 900 degree centigrade, preferably, 745 to 780 degree centigrade (ii) Growth rate: 0.1 to 10 μm/h, preferably, 0.1 to 1 μm/h, or Ga precursor molar flow rate: 2 to 200 μmol/min, preferably 2 to 23.3 μmmol/min.

(iii) In composition: 0.01 to 0.25, or

In precursor molar flow rate: 1 to 100 μmol/min, preferably 6.66 to 11.1 μmol/min.

(iv) Oxygen precursor molar flow rate: $10^{-5}$ to $10^{-1}$ mol/min, preferably $10^{-4}$ to $10^{-2}$ mol/min.

The conditions preferably satisfy all the above-described (i) to (iv).

Hereinafter, the present invention will be described on the basis of examples. Silane ($SiH_4$) used as a doping gas in the examples and reference examples is used so as to be diluted with hydrogen into 10 ppm. Further, in the respective examples, the device is designed such that a light emitting wavelength is made about 400 to 410 nm. Further, in the example in which oxygen is doped in a process of forming a quantum well structure, a molar flow rate of an oxygen doping gas is made excessive more than a molar flow rate of a Group III precursor gas.

EXAMPLE 1

In the present example, a quantum well structure on which oxygen was doped was fabricated, and the characteristics thereof were evaluated.

FIG. 1 is a diagram showing a layer structure of a sample used in the present experimental example. A semiconductor multilayer film of a quantum well structure is provided above an undoped GaN layer 1301 formed on a sapphire substrate 1300, and a protective film 1304 is formed above it. Both of barrier layers 1302 and well layers 1303 constituting a quantum well are composed of InGaN. Oxygen doping is carried out by introducing oxygen diluted with nitrogen into a film-forming chamber at the time of growing the barrier layers and the well layers.

Figure 2:
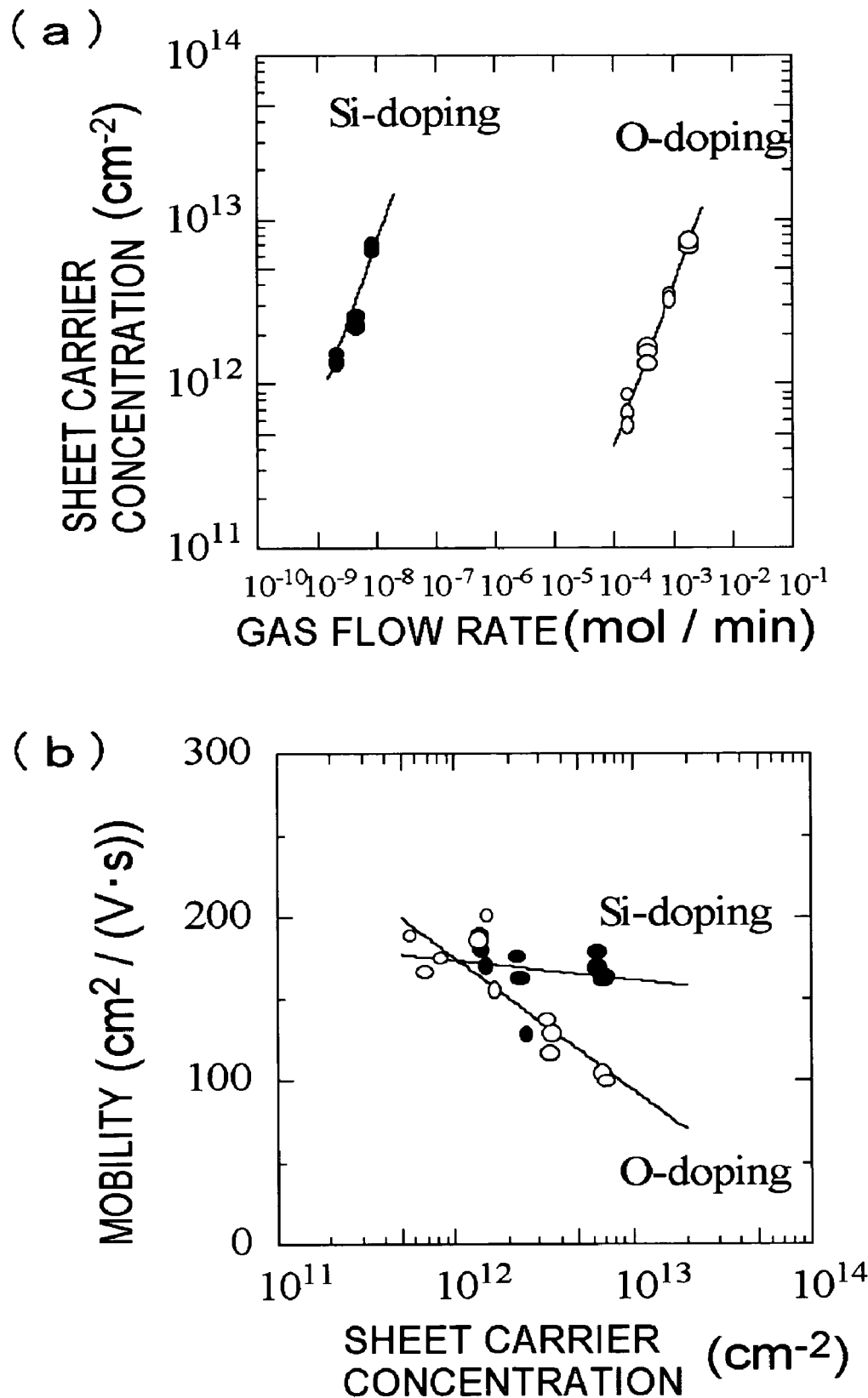
FIG. 2 is graphs showing results of hole measurements in the example 1.

FIG. 2 is results of hole measurements at room temperature of the samples fabricated at a substrate temperature of 765 degree centigrade. It was verified from FIG. 2(a) that a carrier concentration can be controlled with respect to any impurity in proportion with a molar flow rate, and a doping efficiency of oxygen doping is lower than that of silicon doping. Further, it was verified from FIG. 2(b) that the dependency on a carrier concentration with respect to mobility of oxygen doping is more remarkable as compared with that of silicon doping. In accordance therewith, the difficulty in controlling the characteristics of a quantum well layer by oxygen doping can be understood. Note that, from the results of the hole measurements and results of SIMS analysis (FIG. 6) which will be described later, it was verified that 1/20 of the doped oxygen generate carriers in a case of oxygen doping.

Figure 3:
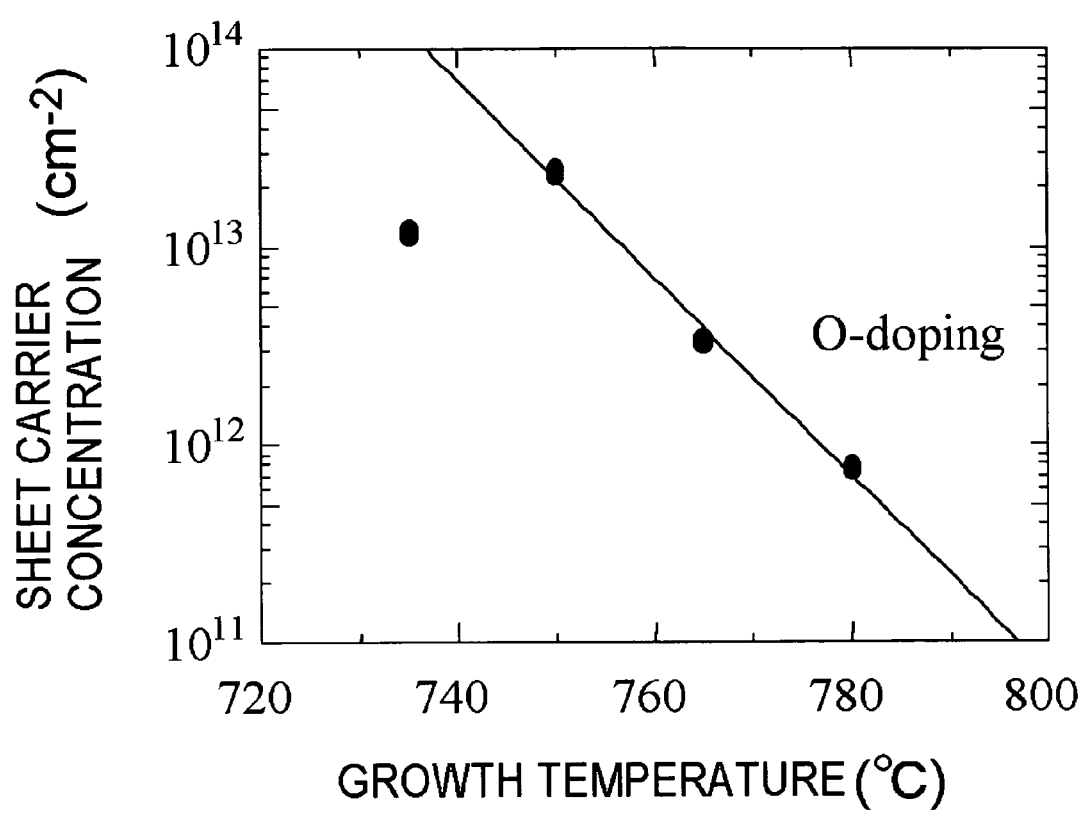
FIG. 3 is a graph showing growth temperature dependency of carrier concentrations (in proportion with an oxygen doping amount).

FIG. 3 is a graph showing the dependency on a growth temperature of a carrier concentration (which is in proportion with oxygen concentration). As described above, in oxygen introduction in this experiment, oxygen is introduced at the time of growing the barrier layers and the well layers. However, a substrate temperature at the time of growing the layers is on the abscissa. From the results in the graph, it can be understood that a doping amount of oxygen has the strong dependency on a temperature, and only oxygen whose concentration is extremely low is doped in the growth at a high temperature. Further, when a temperature is too low as well, a doping amount is further reduced (data at 735 degree centigrade in the graph). However, this can be speculated because the crystallization is deteriorated due to oxygen being fetched too much. Note that, because a oxygen doping amount is reduced as a substrate temperature rises, this strong dependency on a temperature is not due to the efficiency in disassembling oxygen. On the other hand, in silicon used as a normal impurity, the dependency on a temperature is extremely small. This is clear from the fact that equivalent introduction efficiencies could be obtained at both of 700 to 800 degree centigrade which is a growth temperature of InGaN and 1000 to 1150 degree centigrade which is a temperature at the time of growing an n-type AlGaN cladding layer. In accordance with the above descriptions, it can be understood that, in a case of doping oxygen, doping conditions for doping at a density to an extent at which the characteristics of a light emitting device can be improved are within an extremely narrow range.

Figure 4:
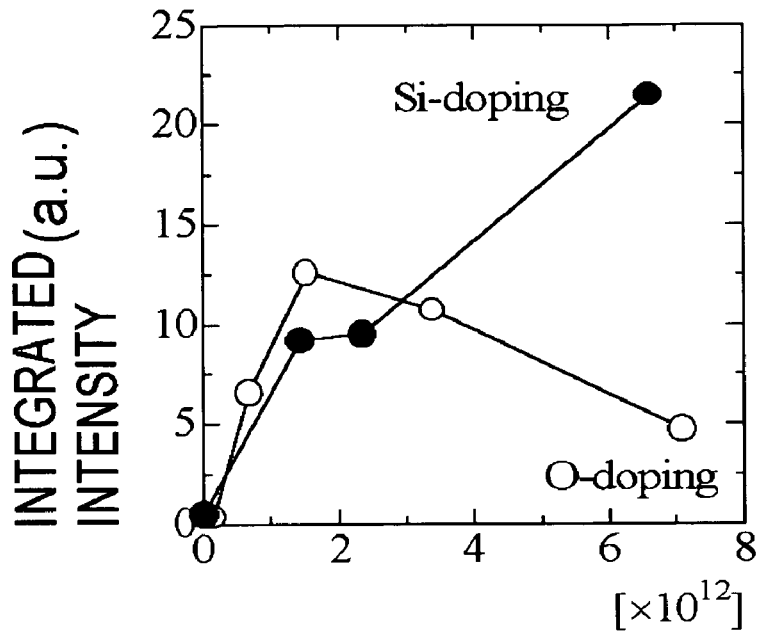
FIG. 4 is graphs showing evaluation results of the carrier concentration dependency of a PL (photo luminescence) characteristic with respect to a semiconductor laser having the structure of FIG. 1.
Figure 4:
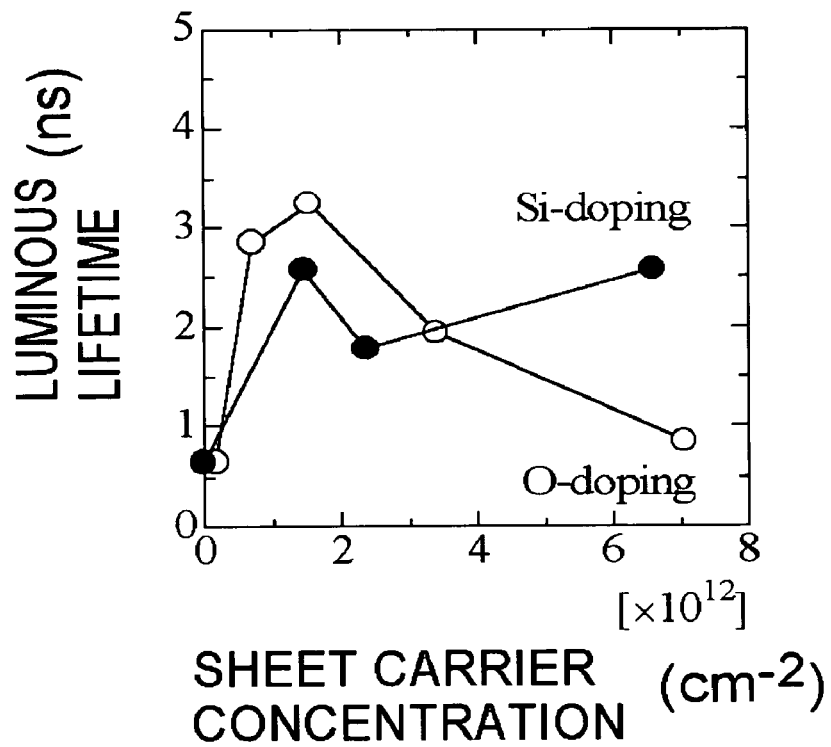
Figure 5:
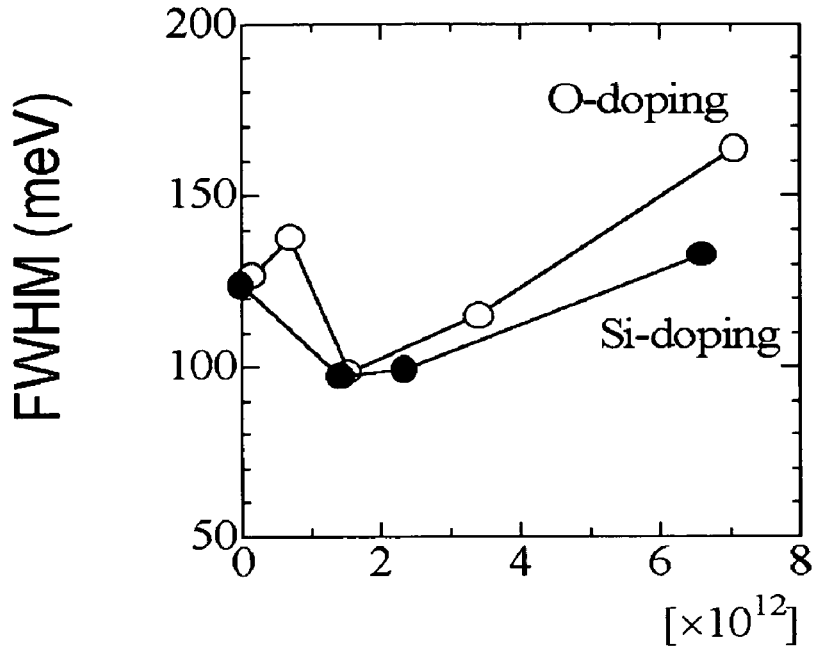
FIG. 5 is graphs showing evaluation results of the carrier concentration dependency of a PL (photo luminescence) characteristic with respect to a semiconductor laser having the structure of FIG. 1.
Figure 5:
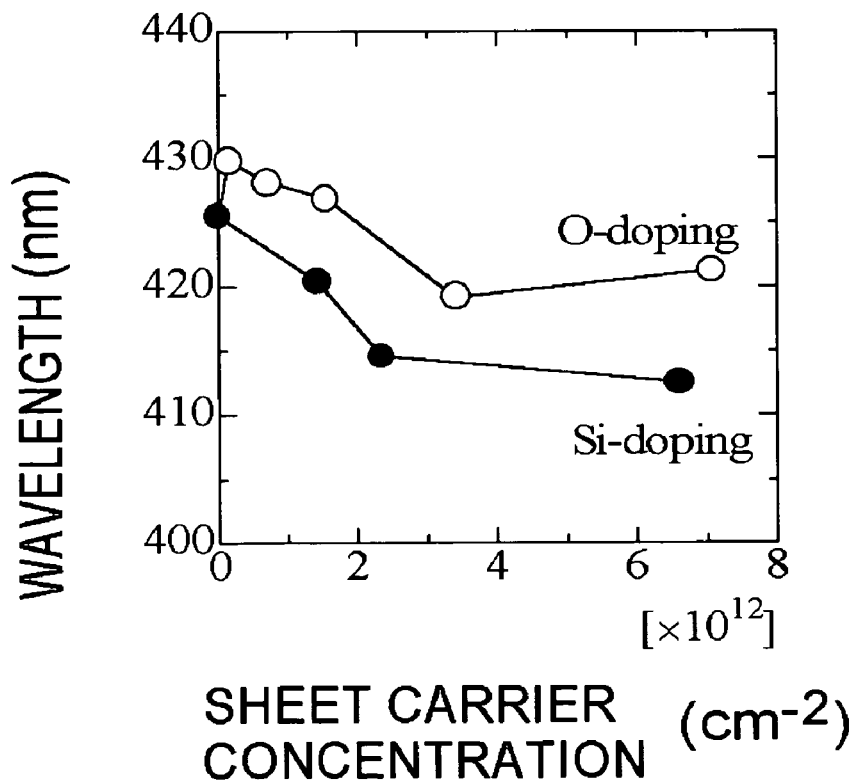

FIG. 4 and FIG. 5 are graphs in which the dependency on a carrier concentration of a PL (photo luminescence) characteristic was evaluated with respect to the structure of FIG. 1. FIG. 4(a), FIG. 4(b), FIG. 5(a), and 5(b) respectively show integrated intensities, luminous lifetimes, FWHM (Full Width of Half Maximum), and light emitting wavelengths. In the graphs, "Sheet carrier concentration" means a sheet carrier concentration per quantum well.

From these results, it was cleared that a satisfactory PL characteristic can be obtained by setting a concentration range per quantum well as, a carrier concentration (sheet concentration) which is greater than or equal to $0.6 \times 10^{12}$ cm$^{-2}$ and less than or equal to $7 \times 10^{12}$ cm$^{-2}$, and an element concentration (sheet concentration) which is greater than or equal to $1.3 \times 10^{13}$ cm$^{-2}$ and less than or equal to $14 \times 10^{13}$ cm$^{-2}$. Note that the method for evaluating a PL (photo luminescence) characteristic used in the present example is not affected by a layer structure other than the quantum well layer. Accordingly, the above-described results can be applied in the same way to various semiconductor lasers, light emitting diodes, and the like which have similar quantum well structures.

Figure 6:
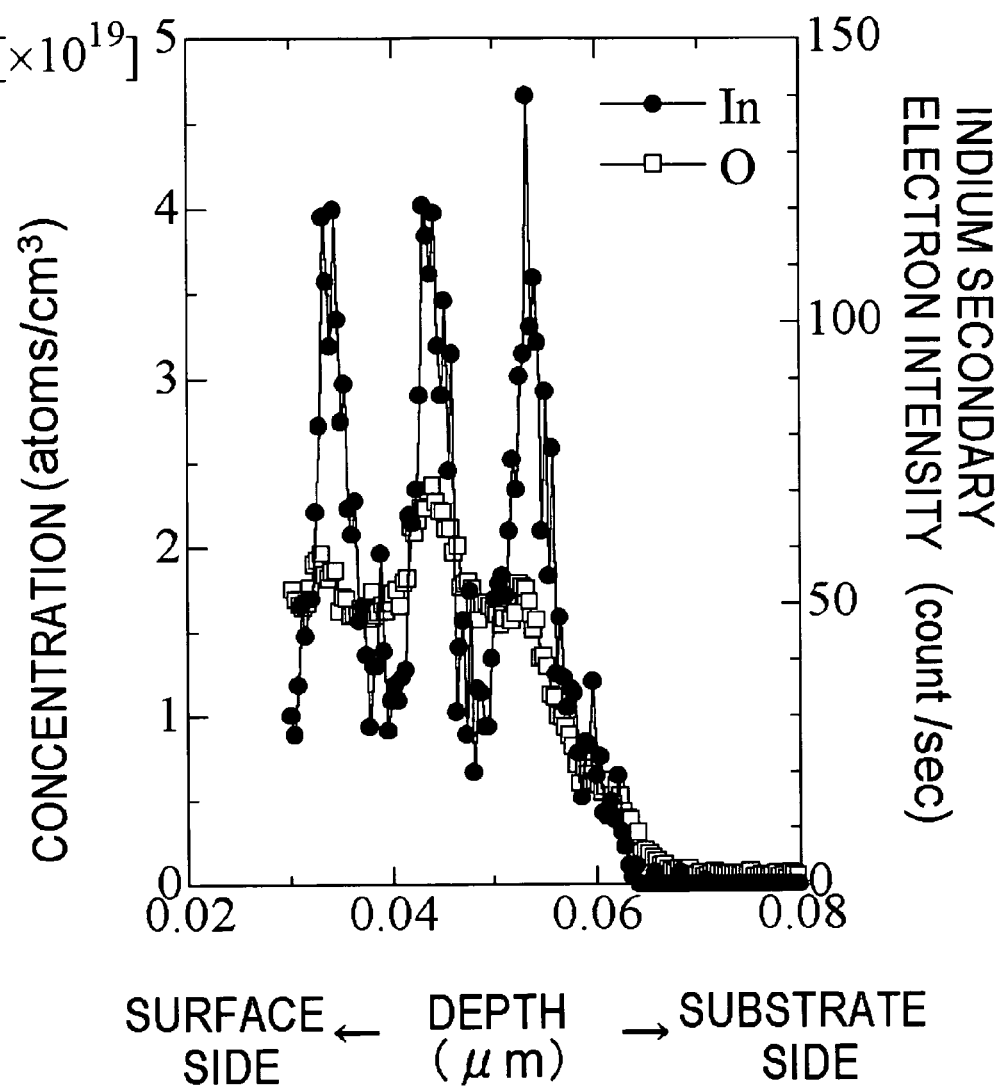
FIG. 6 is a graph showing results of analyses of an oxygen concentration in a quantum well by a SIMS with respect to a structure same as in FIG. 1.

FIG. 6 is the results that oxygen concentrations in the quantum well are analyzed by a SIMS with respect to a structure which is same as that of FIG. 1. It was verified that oxygen of about $2 \times 10^{19}$ cm$^{-3}$ exists in the quantum well. Because the thickness of the entire quantum well layer is 49 nm, and the number of wells is 3, an element concentration (sheet concentration) per quantum well is made to be $2 \times 10^{19}$ (cm$^{-3}$)$\times 49 \times 10^{-7}$/3=$3.3 \times 10^{13}$ (cm$^{-2}$).

Figure 7:
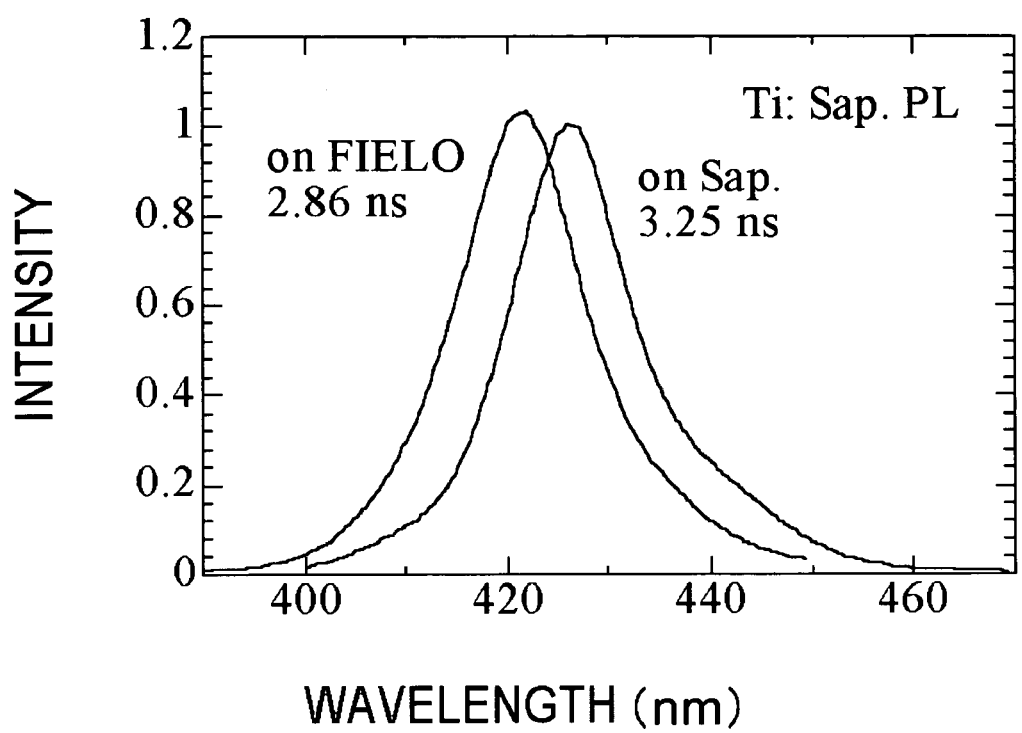
FIG. 7 is a graph in which luminescence characteristics of a structure using a sapphire substrate and a structure using a GaN substrate are compared with one another.

The above experiment used the sapphire substrate. However, when an experiment using a low dislocation GaN substrate (whose surface dislocation density is less than or equal to $10^{17}$) obtained by the FIELO method described above was carried out, in the same way as described above, a structure showing a satisfactory PL characteristic could be obtained. FIG. 7 is a graph in which the luminescence characteristics of a structure using a sapphire substrate and a structure using a GaN substrate have been compared. It was verified that the structure using a FIELO substrate as well shows a satisfactory luminous intensity and a radiation lifetime.

EXAMPLE 2

In the present example, a semiconductor laser having a quantum well active layer on which oxygen was doped was fabricated and evaluated.

Figure 8:
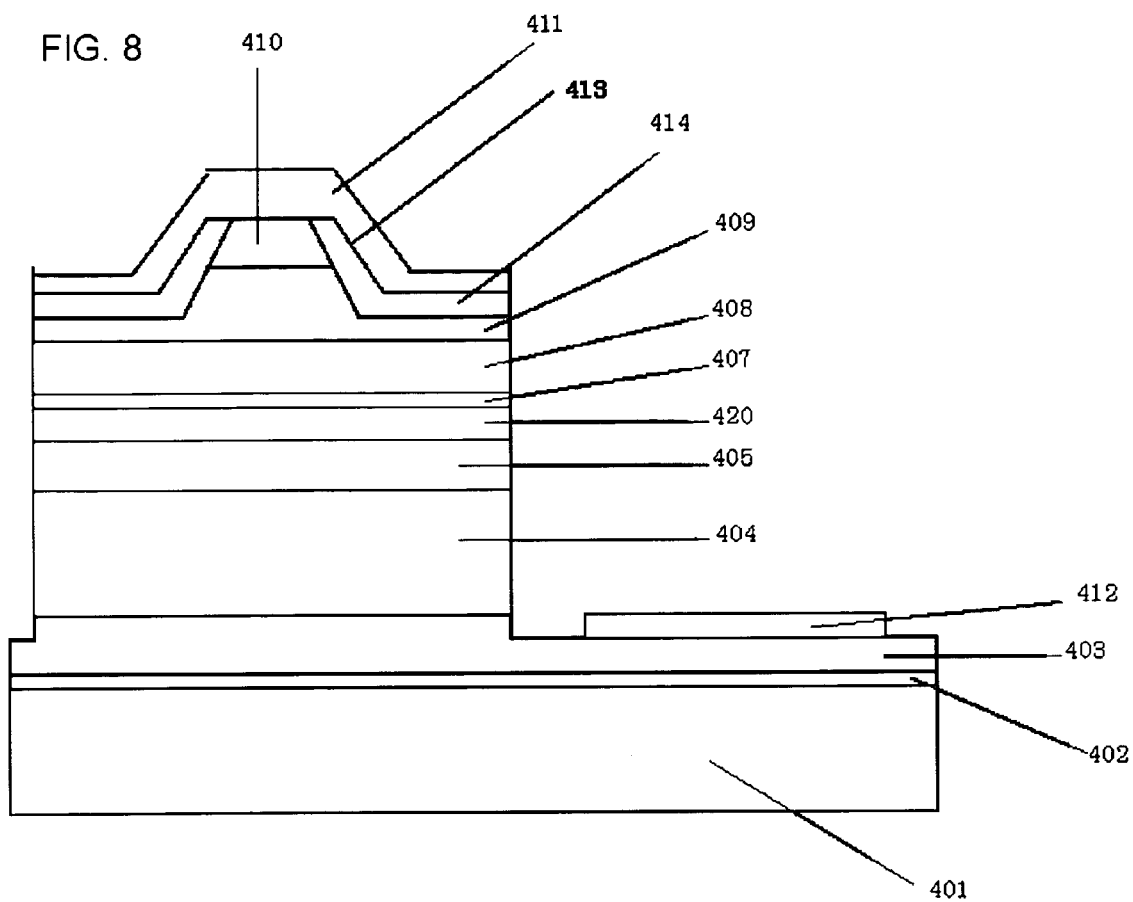
FIG. 8 is a schematic sectional view of a Group III-V nitride semiconductor laser described in an example 2.

FIG. 8 is a schematic sectional view of a Group III-V nitride semiconductor laser relating to the present example. In FIG. 8, on a sapphire substrate 401 whose thickness is 330 μm with the c plane serving as a surface, a low temperature GaN buffer layer 402 whose thickness is 40 nm, an n-type GaN contact layer 403 whose thickness is 1.5 μm, an n-type $Al_{0.07}Ga_{0.93}N$ cladding layer 404 whose thickness is 1 μm, an n-type GaN optical guide layer 405 whose thickness is 0.1 μm, a three-cycle multi-quantum well structure active layer 420 composed of $In_{0.2}Ga_{0.8}N$ quantum well layers whose thicknesses are 3 nm and $In_{0.02}Ga_{0.98}N$ barrier layers whose thicknesses are 10 nm, a p-type $Al_{0.2}Ga_{0.8}N$ cap layer 407 whose thickness is 20 nm, a p-type GaN optical guide layer 408 whose thickness is 0.1 μm, a p-type $Al_{0.07}Ga_{0.93}N$ cladding layer 409 whose thickness is 0.6 μm, a p-type GaN contact layer 410 whose thickness is 0.05 μm, a p-electrode 411 composed of two-layered metal of Ni/Au, and an n-electrode 412 composed of two-layered metal of Ti/Al are formed. In FIG. 8, the p-type cladding layer 409 and the p-type GaN contact layer 410 are processed by etching to be a stripe-formed ridge structure 413 whose width is 3 μm, and electric current is constricted onto only the ridge portion by an $SiO_2$ film 414 formed by removing the head portion of the ridge. Further, in FIG. 8, the n-type contact layer 403 is exposed by etching, and the n-electrode 412 is formed on the top surface thereof.

Next, the processes of the layer structure of FIG. 8 will be described. A metal organic chemical vapor deposition (hereinafter MOCVD) system) is used for forming the respective semiconductor layers. The growth pressures are set to 100 Torr at all regions of the growths of the semiconductor layers. Further, by using ammonia (hereinafter $NH_3$) as a Group V element precursor, and using trimethylgallium (hereinafter TMG), trimethylaluminum (hereinafter TMA), trimethylindium (hereinafter TMI), bis-ethyl cyclopentadienyl magnesium (hereinafter (EtCp)2Mg), silane diluted to 10 ppm with H2 (hereinafter $SiH_4$), and oxygen ($O_2$) diluted to 20% with $N_2$ as Group III element precursors, and by bubbling with respect to the organic metals with $N_2$ under a pressure of 760 Torr with the respective cylinder temperatures being set to −10 degree centigrade, 20 degree centigrade, 30 degree centigrade, and 30 degree centigrade, the saturated vapors are supplied into a reactor. First, the sapphire substrate 401 with the c plane serving as the surface is installed in the reactor, and cleaning of the substrate surface was carried out by heating it at 1100 degree centigrade under the hydrogen atmosphere. Next, the low temperature GaN buffer layer 402 whose thickness is 40 nm is formed on the sapphire substrate 401, with the substrate temperature being set to 500 degree centigrade, by supplying TMG at 5 sccm and $NH_3$ at 10 slm. Next, the supply of TMG is stopped, and the substrate temperature is set to 1100 degree centigrade. Next, the n-type GaN contact layer 403 whose thickness is 1.5 μm was formed on the substrate by supplying TMG at 15 sccm, and $SiH_4$ at 5 sccm and $NH_3$ at 10 slm serving as impurities, and moreover, on the substrate, the n-type $Al_{0.07}Ga_{0.93}N$ cladding layer 404 whose thickness is 1 μm is formed by supplying TMG at 15 sccm, TMA at 5 sccm, $SiH_4$ at 5 sccm, and $NH_3$ at 10 slm, and next, the n-type GaN optical guide layer 405 whose thickness is 0.1 μm is formed by supplying TMG at 15 sccm, SiH$_4$ at 5 sccm, and NH$_3$ at 10 slm. Next, the multi-quantum well structure active layer 420 composed of three cycles of the In$_{0.2}$Ga$_{0.8}$N quantum well layers whose thicknesses are 3 nm and the In$_{0.02}$Ga$_{0.98}$N barrier layers whose thicknesses are 5 nm is formed on the substrate, while maintaining the temperature of the substrate 401 at 800 degree centigrade, by supplying TMG at 10 sccm, TMI at 50 or 30 sccm, O2 at 5 sccm, and NH3 at 10 slm.

Here, the formation of the multi-quantum well structure active layer 420 will be described in detail. First, because the formation of the n-type GaN optical guide layer 405 using SiH$_4$ has been carried out before forming the multi-quantum well structure active layer 420, there is the concern that SiO$_2$ and the like are generated due to SiH$_4$ and O$_2$ to be used next reacting in piping or the reactor. Then, after forming the n-type GaN optical guide layer 405, the growth is once interrupted, a purge for about 10 seconds or more is carried out by making a purge gas to flow. At that time, the purge gas supplied to the reactor is only NH$_3$ and carrier. Generally, GaN is made to grow by using H$_2$ carrier at a relatively high temperature (about 1000 degree centigrade or more), and in contrast thereto, because InGaN is made to grow by using N$_2$ carrier at a relatively low temperature (about 700 to 800 degree centigrade) in many cases, it is recommended that lowering the temperature of the substrate and switching of the carrier gas be carried out therebetween.

Note that, in the present example, Si was used as the impurity for the optical guide layer 405, and oxygen was used as the impurity for the active layer 420. A method in which oxygen is doped in the both may be considered. However, in accordance with the way as in the present example, a satisfactory luminescence characteristic can be stably obtained.

Figure 9:
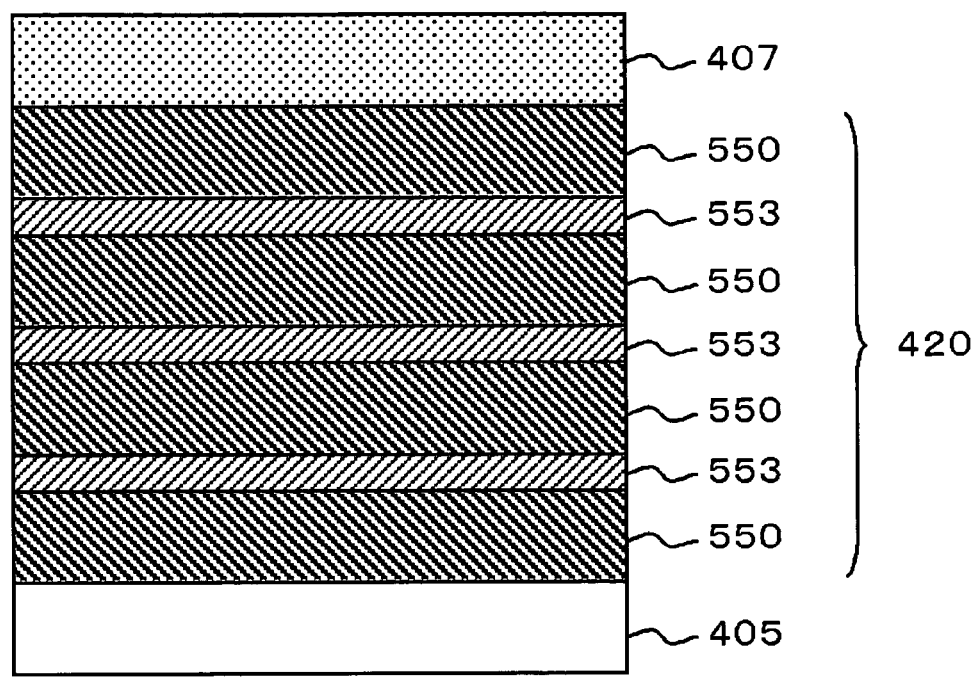
FIG. 9 is a diagram showing a structure of active layers having a multi-quantum well structure in FIG. 8.

Next, a quantum well structure as shown in FIG. 9 is formed with the temperature of the sapphire substrate 401 being maintained at 800 degree centigrade. First, an n-type In$_{0.02}$Ga$_{0.98}$N barrier layer 550 of 10 nm is formed by supplying TMG at 10 sccm, TMI at 30 sccm, O$_2$ at 20 sccm, and NH$_3$ at 10 slm onto the n-type GaN optical guide layer 405. Next, the molar flow rate of TMI is increased to 50 sccm, the supply of oxygen is stopped, and an In$_{0.2}$Ga$_{0.8}$N well layer 553 of 3 nm is formed. This process is repeated three cycles, and finally, the process is completed with the n-type In$_{0.02}$Ga$_{0.98}$N barrier layer 550. The above-described processes of forming an active layer were executed without being taken out of the deposition apparatus. As described above, since oxygen doping is sensitive to a substrate temperature as compared with Si doping, the control with respect to a substrate temperature at ±5 degree centigrade is required in order for a doping amount to be suppressed to a practical range (for example, from about ½ to about twice as many as a designed value). This is enough to be able to be realized.

The p-type Al$_{0.2}$Ga$_{0.8}$N cap layer 407 whose thickness is 20 nm was formed by supplying TMG1 at 5 sccm, TMA at 5 sccm, and (EtCp)$_2$Mg at 5 sccm and NH$_3$ at 10 slm as impurities onto the multi-quantum well structure active layer 420 formed in this way. Next, the p-type GaN optical guide layer 408 whose thickness is 0.1 μm was formed, with the temperature of the substrate 401 being maintained at 1100 degree centigrade, by supplying TMG at 15 sccm, and (EtCp)$_2$Mg at 5 sccm and NH$_3$ at 10 slm as dopant onto the substrate. Next, the p-type Al$_{0.07}$Ga$_{0.93}$N cladding layer 409 is formed by supplying TMG at 15 sccm, TMA at 5 sccm, and (EtCp)$_2$Mg at 5 sccm and NH$_3$ at 10 slm as impurities.

Next, the p-type GaN contact layer 410 whose thickness is 0.05 μm was formed by supplying TMG at 15 sccm, (EtCp)$_2$Mg at 5 sccm, and NH$_3$ at 10 slm onto the substrate. Thereafter, the substrate 401 was taken out of the deposition apparatus, and the p-type Al$_{0.07}$Ga$_{0.93}$N cladding layer 409 and the p-type GaN contact layer 410 were processed to be the stripe-formed ridge structure 413 having a width of 3 μm. Moreover, the SiO$_2$ film 414 is formed by removing the head portion of the ridge, and the p-electrode 411 composed of two-layered metal of Ni/Au was formed by vacuum evaporation. Further, the n-type GaN contact layer 403 was exposed by etching, and the n-electrode 412 composed of two-layered metal of Ti/Al was formed by vacuum evaporation on the top surface thereof.

In the present example, at the time of forming the quantum well structure active layer 420, a large quantity of oxygen was made to flow. In a case of doping Si, in contrast to the fact that the molar flow rate of SiH$_4$ is 2.2 nmol/min (10 ppm, 5 sccm), the molar flow rate of O$_2$ in the present example is 0.36 mmol/min (20%, 20 sccm, which is converted into oxygen atoms), which is about five-figure greater than it. The reason for this may be speculated that, because the coupling of Si—N is relatively strong (439±38 kJ/mol), almost all the Si adhered onto the crystal surfaces are fetched into the crystals without being reevaporated, and in contrast thereto, because the coupling of Ga—O is relatively weak (353.6±41.8 kJ/mol), most of the O adhered onto the crystal surfaces are reevaporated. This coincides with the fact that a carrier concentration of a sample on which oxygen has been doped strongly depends on a substrate temperature (FIG. 3).

The obtained active layer of the semiconductor laser has a structure in which barrier layers/well layers including n-type regions have been laminated in this order as shown in FIG. 9. The sheet carrier concentrations in the respective layers are about $1.5 \times 10^{12}$ cm$^{-2}$, and the oxygen concentrations are about $3 \times 10^{13}$ cm$^{-2}$.

Note that, when a simple evaluation by wet-etching was carried out with respect to the samples in which the semiconductor layers were formed by the processes which are the same as described above, and the polarity of the p-type GaN contact layer 410 was examined, it was confirmed that the surface of the layer is a Ga plane (c plane).

When the luminous intensity and the luminous lifetime with respect to the semiconductor laser of the present example were evaluated by a normal method, the luminous intensity was 17 a.u., and the luminous lifetime was 3.25 ns. In accordance with the present example, the luminous efficiency can be improved while maintaining the crystallization of the active layer to be satisfactory.

Further, according to the manufacturing method shown in the present example, there is the advantage as well that the composition can be prevented from being fluctuated by hydrogen at the time of doping an impurity onto the InGaN quantum well active layer. A carrier gas at the process of growing InGaN is preferably an inert gas such as nitrogen or the like. This is because, if a hydrogen carrier is used, the hydrogen affects the efficiency of In incorporation, and there are cases in which fluctuations in the InGaN composition and the InGaN light emitting wavelengths are brought about. Here, SiH$_4$ which is a silicon doping gas is usually diluted with hydrogen. Accordingly, when growth of InGaN is carried out by using this doping gas, there are cases in which the InGaN composition and the InGaN light emitting wavelength are fluctuated due to the existence of hydrogen. In the present example, oxygen is used as dopant, and a doping gas in which the dopant is diluted with nitrogen is used. Because nitrogen is used as a dilution gas, a fluctuation in the efficiency of In incorporation is little, and stable InGaN composition and InGaN light emitting wavelength can be obtained.

EXAMPLE 3

Figure 10:
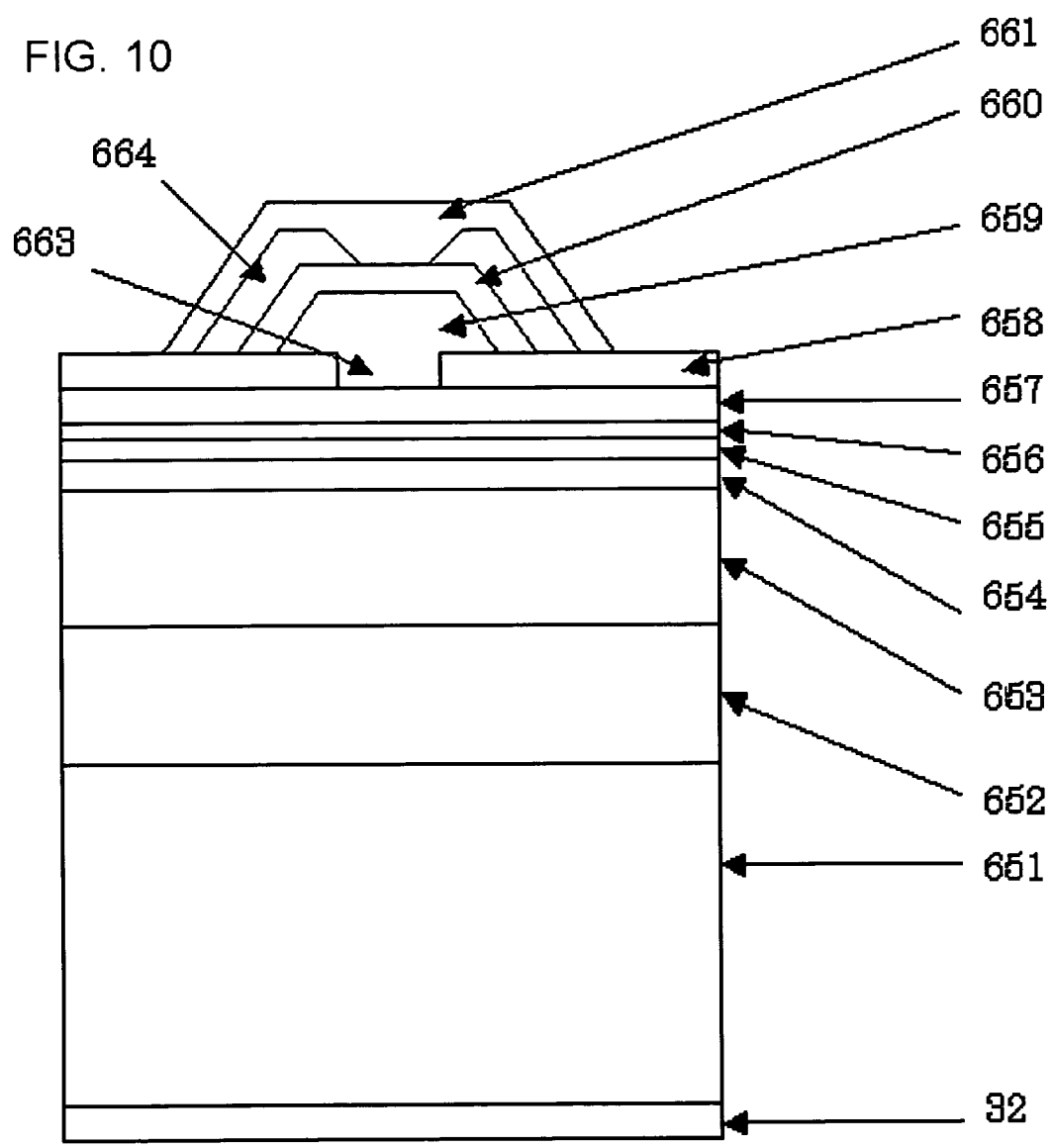
FIG. 10 is a schematic sectional view of a Group III-V nitride semiconductor laser described in an example 3.

In the present example, a semiconductor laser having a quantum well active layer in which a Group III nitride semiconductor layer was made to grow on a low-dislocation GaN substrate, and on which oxygen was doped was fabricated and evaluated. FIG. 10 is a schematic sectional view of a Group III-V nitride semiconductor laser relating to the present example. In this Group III-V nitride semiconductor laser, a laser structure is formed on an n-type GaN substrate 651 whose thickness is 330 μm with a c plane serving as a surface thereof. This n-type GaN substrate 651 was fabricated by the FIELO method described above, and when a density of etch pits generated by using a phosphoric acid solution was measured, the surface dislocation density was less than $10^8$/cm. Because the surface dislocation density of the substrate is low, the dislocation density of the active layer to be formed above it can be reduced, and the effect on improving a luminous efficiency by a doping profile of an n-type impurity can be more remarkably obtained. Hereinafter, the method of manufacturing a semiconductor laser of the present example will be described.

First, on the n-type GaN substrate 651, an n-type GaN layer 652 whose thickness is 1.5 μm, an n-type $Al_{0.07}Ga_{0.93}N$ cladding layer 653 whose thickness is 1 μm, an n-type GaN optical guide layer 654 whose thickness is 0.1 μm, a multi-quantum well structure active layer 655 composed of three-cycles of $In_{0.2}Ga_{0.8}N$ quantum well layers whose thicknesses are 3 nm and $In_{0.02}Ga_{0.98}N$ barrier layers whose thicknesses are 10 nm, a p-type $Al_{0.2}Ga_{0.8}N$ cap layer 656 whose thickness is 20 nm, a p-type GaN optical guide layer 657 whose thickness is 0.1 μm, a silicon oxide mask 658 which is formed on the p-type GaN optical guide layer 657 and which has a stripe-formed opening portion 663 having a width of 2 μm in a direction, a p-type $Al_{0.07}Ga_{0.93}N$ cladding layer 659 which is selectively formed on the silicon oxide mask 658 and whose thickness is 0.5 μm, a p-type GaN contact layer 660 whose thickness is 0.05 μm, a p-electrode 661 composed of two-layered metal of Ni/Au, and an n-electrode 32 composed of two-layered metal of Ti/Al are formed.

Next, the processes of forming the semiconductor layers will be described. An MOCVD system was used for forming the semiconductor layers. The growth pressures are set to 100 Torr at all regions. Further, by using $NH_3$ as a Group V element precursor, and using TMG, TMA, TMI, $(EtCp)_2Mg$, and $SiH_4$ as Group III element precursors, and by bubbling with respect to the organic metals with $N_2$ under a pressure of 760 Torr with the respective cylinder temperatures being set to −10 degree centigrade, 20 degree centigrade, and 30 degree centigrade, the saturated vapors were supplied into a reactor. First, the n-type GaN substrate 651 with the c plane serving as the surface is installed in the reactor, and was heated to 1100 degree centigrade under the hydrogen atmosphere, and the n-type GaN layer 652 whose thickness is 1.5 μm was formed on the substrate by supplying TMG at 15 sccm, and $SiH_4$ at 5 sccm and $NH_3$ at 10 slm serving as dopants. Moreover, the n-type $Al_{0.07}Ga_{0.93}N$ cladding layer 653 whose thickness is 1 μm was formed by supplying TMG at 15 sccm, TMA at 5 sccm, $SiH_4$ at 5 sccm, and $NH_3$ at 10 slm on the substrate, and next, the n-type GaN optical guide layer 654 whose thickness is 0.1 μm was formed by supplying TMG at 15 sccm, $SiH_4$ at 5 sccm, and $NH_3$ at 10 slm. Next, the multi-quantum well structure active layer 655 composed of three-cycles of the $In_{0.2}Ga_{0.8}N$ quantum well layers whose thicknesses are 3 nm and the $In_{0.02}Ga_{0.98}N$ barrier layers whose thicknesses are 10 nm was formed on the substrate, while maintaining the temperature of the N-type GaN substrate 651 at 800 degree centigrade, by supplying TMG at 10 sccm, TMI at 50 sccm, or 30 sccm and $NH_3$ at 10 slm.

Here, the formation of the multi-quantum well structure active layer 655 will be described in detail with reference to FIG. 11. An n-type $In_{0.02}Ga_{0.98}N$ layer 750 of 10 nm is formed, with the temperature of the N-type GaN substrate 651 being maintained at 800 degree centigrade, by supplying TMG at 10 sccm, TMI at 30 sccm, $O_2$ (oxygen) at 20 sccm, and $NH_3$ at 10 slm. Next, an undoped $In_{0.2}Ga_{0.8}N$ layer 753 of 3 nm is formed by increasing the molar flow rate of TMI to 50 sccm. This process is repeated three cycles, and finally, the processes are completed with the n-type $In_{0.02}Ga_{0.98}N$ layer 750. The above-described active layer forming processes were executed without being taken out of the deposition apparatus.

The process returns to FIG. 10, and next, the p-type $Al_{0.2}Ga_{0.8}N$ cap layer 656 whose thickness is 20 nm was formed by supplying TMG at 15 sccm, TMA at 5 sccm, and $(EtCp)_2Mg$ at 5 sccm and $NH_3$ at 10 slm as dopants onto the quantum well structure active layer 655. Next, the p-type GaN optical guide layer 657 whose thickness is 0.1 μm was formed, with the temperature of the N-type GaN substrate 651 being maintained at 1100 degree centigrade, by supplying TMG at 15 sccm, and $(EtCp)_2Mg$ at 5 sccm and $NH_3$ at 10 slm as dopants on the substrate. Next, the silicon oxide mask 658 was formed. First, the N-type GaN substrate 651 was taken out of the deposition apparatus after being cooled down to room temperature, and after forming a silicon oxide film whose film thickness is 0.2 μm by a sputtering apparatus, the opening portion 663 whose width is 2.0 μm was formed by a photolithography process and an etching process. Thereafter, the N-type GaN substrate 651 was installed in the deposition apparatus again and was heated to 1100 degree centigrade, and the p-type $Al_{0.2}Ga_{0.8}N$ cladding layer 659 was formed by supplying TMG at 15 sccm, TMA at 5 sccm, and $(EtCp)_2Mg$ at 5 sccm and $NH_3$ at 10 slm as dopants. Next, the p-type GaN contact layer 660 whose thickness is 0.05 μm was formed by supplying TMG at 15 sccm, $(EtCp)_2Mg$ at 5 sccm, and $NH_3$ at 10 slm. Thereafter, the substrate was taken out of the deposition apparatus, the silicon oxide film 664 was formed by removing the head portion of the ridge, and the p-electrode 661 composed of two-layered metal of Ni/Au was formed by vacuum evaporation. Further, the n-electrode 662 composed of two-layered metal of Ti/Al was formed by vacuum evaporation on the back surface of the N-type GaN substrate 651.

Figure 11:
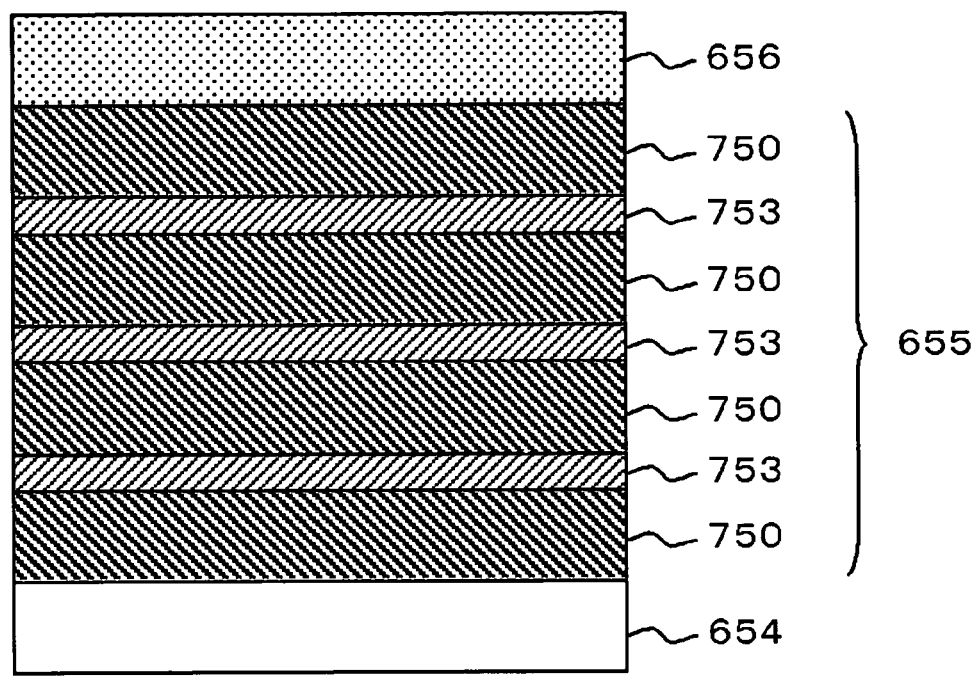
FIG. 11 is a diagram showing a structure of active layers having a multi-quantum well structure in FIG. 10.

The obtained active layer of the semiconductor laser has a structure in which the barrier layers/well layers including n-type regions have been laminated in this order as shown in FIG. 11. The sheet carrier concentrations were about $1 \times 10^{12}$ $cm^{-2}$, and the oxygen concentrations were about $2 \times 10^{13}$ $cm^{-2}$.

Note that, when a simple evaluation by wet-etching was carried out with respect to a sample in which a semiconductor layer was formed by the processes which are the same as described above, and the polarity of the p-type GaN contact layer 660 was examined, it was confirmed that the surface of the layer was a Ga plane (c plane).

When the luminous intensity and the luminous lifetime with respect to the semiconductor laser of the present example were evaluated by a normal method, the luminous intensity was 18 a.u., and the luminous lifetime was 4.0 ns. In accordance with the present example, the luminous efficiency can be improved while maintaining the crystallization of the active layer to be satisfactory.

REFERENCE EXAMPLE 1

Figure 13:
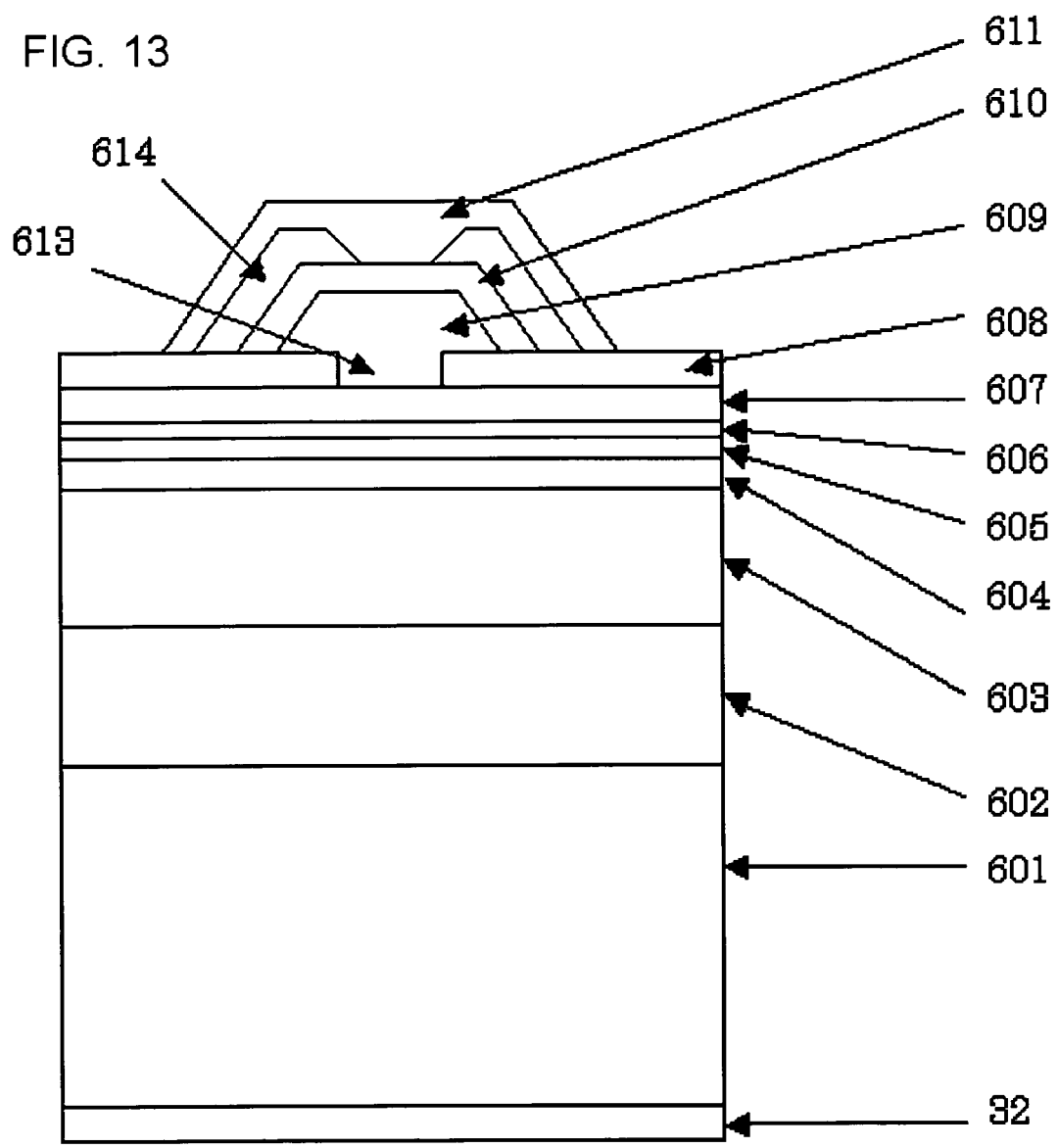
FIG. 13 is a schematic sectional view of a Group III-V nitride semiconductor laser described in a reference example.

FIG. 13 is a schematic sectional view of a Group III-V nitride semiconductor laser relating to the present example. In FIG. 13, in this Group III-V nitride semiconductor laser, a laser structure is formed on an n-type GaN substrate 601 whose thickness is 330 µm with a c plane serving as the surface thereof. This n-type GaN substrate 601 was fabricated by the FIELO method described above, and when a density of etch pits generated by using a phosphoric acid solution was measured, the surface dislocation density of the substrate was less than $10^8$/cm. Because the surface dislocation density of the substrate is low, the dislocation density of the active layer to be formed above it can be reduced, and the effect on improving a luminous efficiency by a doping profile of the n-type impurity can be more remarkably obtained. Hereinafter, the method of manufacturing a semiconductor laser of the present example will be described.

First, on the n-type GaN substrate 601, an n-type GaN layer 602 whose thickness is 1.5 µm, an n-type $Al_{0.07}Ga_{0.93}N$ cladding layer 603 whose thickness is 1 µm, an n-type GaN optical guide layer 604 whose thickness is 0.1 µm, a multi-quantum well structure active layer 605 composed of three cycles of $In_{0.2}Ga_{0.8}N$ quantum well layers whose thicknesses are 3 nm and $In_{0.02}Ga_{0.98}N$ barrier layers whose thicknesses are 10 nm, a p-type $Al_{0.2}Ga_{0.8}N$ cap layer 606 whose thickness is 20 nm, a p-type GaN optical guide layer 607 whose thickness is 0.1 µm, a silicon oxide mask 608 whose thickness is 0.2 µm, which is formed on the p-type GaN optical guide layer 607 and which has an stripe-formed opening portion 613 of a width of 2 µm in a direction, a p-type $Al_{0.07}Ga_{0.93}N$ cladding layer 609 which is selectively formed on the silicon oxide mask 608 and whose thickness is 0.5 µm, a p-type GaN contact layer 610 whose thickness is 0.05 µm, and a p-electrode 611 composed of two-layered metal of Ni/Au are formed. Further, an n-electrode 32 is formed on the back surface of the n-type GaN substrate 601.

Next, the processes of forming the semiconductor layers will be described. An MOCVD system was used for forming the semiconductor layers. The growth pressures are set to 100 Torr at all regions. Further, by using $NH_3$ as a Group V element precursor, and using TMG, TMA, TMI, $(EtCp)_2Mg$, and $SiH_4$ as Group III element precursors, and by bubbling with respect to the organic metals with $N_2$ under a pressure of 760 Torr with the respective cylinder temperatures being set to −10 degree centigrade, 20 degree centigrade, and 30 degree centigrade, the saturated vapors were supplied into a reactor. First, the n-type GaN substrate 601 with the c plane serving as the surface is installed in the reactor, and was heated to 1100 degree centigrade under the hydrogen atmosphere, and the n-type GaN layer 602 whose thickness is 1.5 µm was formed on the substrate by supplying TMG at 15 sccm, and $SiH_4$ at 5 sccm and $NH_3$ at 10 slm serving as dopants. Moreover, the n-type $Al_{0.07}Ga_{0.93}N$ cladding layer 603 whose thickness is 1 µm was formed on the substrate by supplying TMG at 15 sccm, TMA at 5 sccm, $SiH_4$ at 5 sccm, and $NH_3$ at 10 slm, and next, the n-type GaN optical guide layer 604 whose thickness is 0.1 µm was formed by supplying TMG at 15 sccm, $SiH_4$ at 5 sccm, and $NH_3$ at 10 slm. Next, the multi-quantum well structure active layer 605 composed of three-cycles of the $In_{0.2}Ga_{0.8}N$ quantum well layers whose thicknesses are 3 nm and the $In_{0.02}Ga_{0.98}N$ barrier layers whose thicknesses are 10 nm was formed on the substrate, while maintaining the temperature of the N-type GaN substrate 601 at 800 degree centigrade, by supplying TMG at 10 sccm, TMI at 50 sccm, or 30 sccm and $NH_3$ at 10 slm.

Here, the formation of the multi-quantum well structure active layer 605 will be described in detail with reference to FIG. 14. The n-type $In_{0.02}Ga_{0.98}N$ layer 701 of 2.5 nm is formed, with the temperature of the N-type GaN substrate 601 being maintained at 800 degree centigrade, by supplying TMG at 10 sccm, TMI at 30 sccm, $SiH_4$ at 5 sccm, and $NH_3$ at 10 slm. Next, only the supply of $SiH_4$ is stopped, and an undoped $In_{0.02}Ga_{0.98}N$ layer 702 of 7.5 nm is formed by supplying other precursors for 100 seconds. Moreover, an undoped $In_{0.2}Ga_{0.8}N$ layer 703 of 3 nm is formed by increasing the molar flow rate of TMI to 50 sccm. This process is repeated three cycles, and finally, the processes are completed with the undoped $In_{0.02}Ga_{0.98}N$ layer 702. The above-described active layer forming processes were executed without being taken out of the deposition apparatus.

The process returns to FIG. 13, and next, the p-type $Al_{0.2}Ga_{0.8}N$ cap layer 606 whose thickness is 20 nm was formed by supplying TMG at 15 sccm and TMA at 5 sccm, and $(EtCp)_2Mg$ at 5 sccm and $NH_3$ at 10 slm as dopants on the quantum well structure active layer 605. Next, the p-type GaN optical guide layer 607 whose thickness is 0.1 µm was formed on the substrate, with the temperature of the N-type GaN substrate 601 being maintained at 1100 degree centigrade, by supplying TMG at 15 sccm, and $(EtCp)_2Mg$ at 5 sccm and $NH_3$ at 10 slm as dopants. Next, the silicon oxide mask 608 was formed. First, the N-type GaN substrate 601 was taken out of the deposition apparatus after being cooled down to room temperature, and after forming a silicon oxide film whose film thickness is 0.2 µm by a sputtering apparatus, the opening portion 613 whose width is 2.0 µm was formed by a photolithography process and an etching process. Thereafter, the N-type GaN substrate 601 was installed in the deposition apparatus again and was heated to 1100 degree centigrade, and the p-type $Al_{0.2}Ga_{0.8}N$ cladding layer 609 was formed by supplying TMG at 15 sccm and TMA at 5 sccm, and $(EtCp)_2Mg$ at 5 sccm and $NH_3$ at 10 slm as dopants. Next, the p-type GaN contact layer 610 whose thickness is 0.05 µm was formed by supplying TMG at 15 sccm, $(EtCp)_2Mg$ at 5 sccm, and $NH_3$ at 10 slm. Thereafter, the substrate was taken out of the deposition apparatus, and the silicon oxide film 614 was formed by removing the head portion of the ridge, and the p-electrode 611 composed of two-layered metal of Ni/Au was formed by vacuum evaporation. Further, the n-electrode 32 composed of two-layered metal of Ti/Al was formed by vacuum evaporation on the back surface of the N-type GaN substrate 601.

Figure 14:
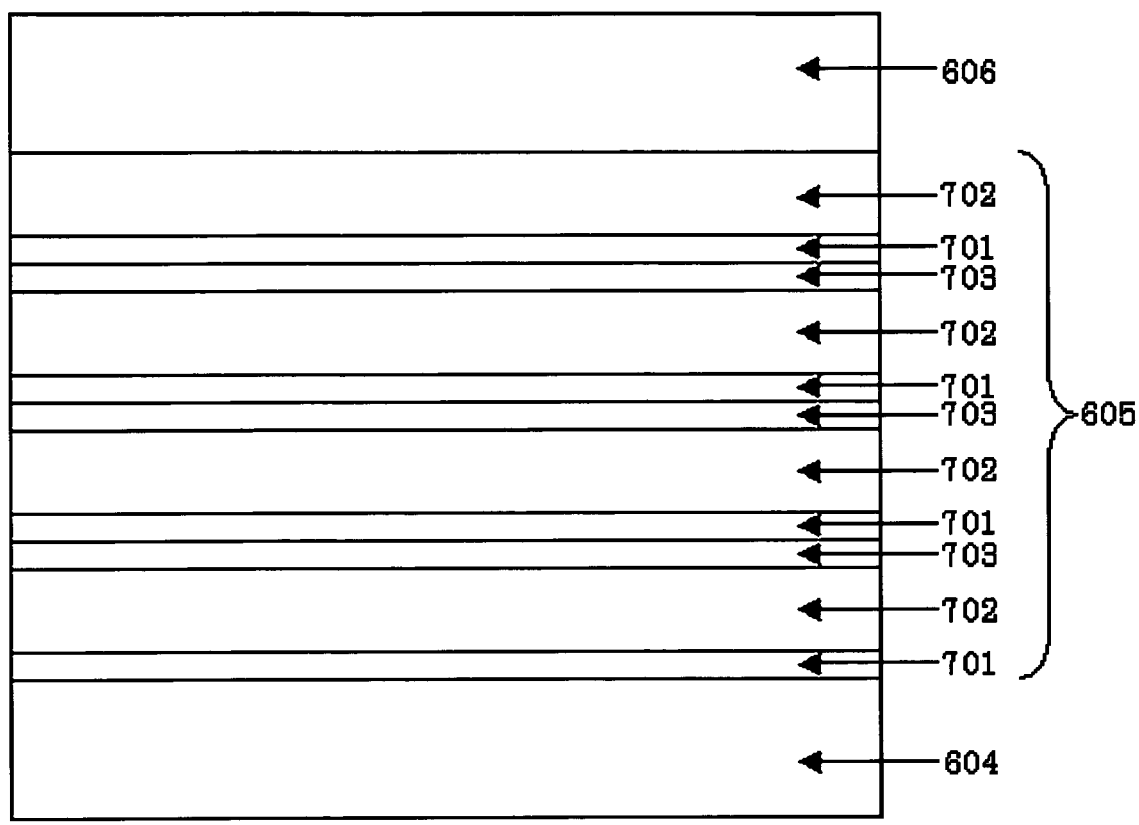
FIG. 14 is a schematic sectional view of a Group III-V nitride semiconductor laser described in a reference example.

The obtained active layer of the semiconductor laser has a structure in which barrier layer undoped regions/well layers/barrier layer n-type regions have been laminated in this order as shown in FIG. 14. The profiles of the respective layers were as follows.

The barrier layer undoped regions ($In_{0.02}Ga_{0.98}N$ layers 702): the layer thickness is 7.5 nm, and the Si concentration is less than $1\times10^{17}$ cm$^{-3}$.

The well layers (undoped $In_{0.2}Ga_{0.8}N$ layers 703): the layer thickness is 3 nm, and the Si concentration is less than $1\times10^{17}$ cm$^{-3}$.

The barrier layer n-type regions (n-type $In_{0.02}Ga_{0.98}N$ layers 701): the layer thickness is 2.5 nm, and the Si concentration (average value) is $4\times10^{18}$ cm$^{-3}$.

The Si concentrations were measured by a SIMS.

Further, when a simple evaluation by wet-etching was carried out with respect to a sample in which a semiconductor layer was formed by the processes which are the same as described above, and the polarity of the p-type GaN contact layer 610 was examined, it was confirmed that the surface of the layer is a Ga plane (c plane).

When the luminous intensity and the luminous lifetime with respect to the semiconductor laser of the present example were evaluated by a normal method, the luminous intensity was 12 a.u., and the luminous lifetime was 1.0 ns.

In the present example, the n-type impurity precursor remained inside the reactor or in the piping of the deposition apparatus can be prevented from being supplied in the process of growing the well layers by providing a time of stopping the n-type impurity precursor after growing the barrier layers on which the n-type impurity has been doped. Therefore, the well layers are not contaminated by the n-type impurity, and high-quality well layers can be obtained. As a result, a light emitting device having a high luminous efficiency can be obtained as described above.

Further, the portions directly under the well layers in the barrier layers are undoped without introducing the n-type impurity which inhibits the growth, thus the crystallization can be improved. The crystallization which has deteriorated at the time of forming the doped layers is restored during the time of growing the undoped layers. Therefore, the crystallization of the well layers formed thereon can be improved, and the luminous efficiency of the light emitting device can be improved from this standpoint.

The sample a is one in which the n-type impurity doping profile of FIG. 15($a$) has been used, and the barrier layer is 10 nm, and the well layer is 3 nm.

The sample b is one in which the n-type impurity doping profile of FIG. 15($c$) has been used, and the barrier layer is 10 nm, the well layer is 3 nm, the barrier layer undoped region is 5 nm, and the barrier layer n-type region is 5 nm.

The sample c is one in which the n-type impurity doping profile of FIG. 15($e$) has been used, and the barrier layer is 10 nm, the well layer is 3 nm, the barrier layer undoped region is 5 nm, and the barrier layer n-type regions are respectively 2.5 nm.

In the samples a, b, and c, the Si concentrations were less than $1 \times 10^{17}$ cm$^{-3}$ at the barrier layer undoped regions, and the Si concentrations (average values) were $4 \times 10^{18}$ cm$^{-3}$ at the barrier layer n-type regions. The results are shown in table 1.

REFERENCE EXAMPLE 3

In the semiconductor laser shown in reference example 1 and FIG. 13, a sample in which the Si concentration (average value) of the barrier layer n-type regions (n-type $In_{0.02}Ga_{0.98}N$ layers 701) was made $1 \times 10^{19}$ cm$^{-3}$ was fabricated and evaluated. The results are shown in table 1. It was cleared that the luminous efficiency is further reduced by the Si concentration in the present example.

TABLE 1

| SAMPLE | DOPING METHOD | LUMINOUS INTENSITY/a.u. | LUMINOUS LIFETIME/ns |
|---|---|---|---|
| REFERENCE EXAMPLE 2 SAMPLE a | Si DOPING UNIFORMLY ONTO THE ENTIRE BARRIER LAYERS | 9.0 | 0.6 |
| REFERENCE EXAMPLE 2 SAMPLE b | Si DOPING DIRECTLY UNDER THE WELL LAYERS | 3.5 | 0.31 |
| REFERENCE EXAMPLE 2 SAMPLE c | Si DOPING THERE IS A SPACER LAYER | 4.3 | 0.37 |
| REFERENCE EXAMPLE 1 | Si DOPING DIRECTLY AFTER THE WELL LAYERS | 12 | 1.0 |
| REFERENCE EXAMPLE 3 | Si DOPING DIRECTLY AFTER THE WELL LAYERS | 8 | 0.6 |
| EXAMPLE 1 | O$_2$ DOPING ONTO THE ENTIRE QUANTUM WELL | 17 | 3.25 |
| EXAMPLE 2 | O$_2$ DOPING ONTO THE ENTIRE QUANTUM WELL | 18 | 4.0 |

Moreover, in the present example, the N-type GaN substrate 601 having a low dislocation density is used as a crystal growth front-end substrate. Therefore, the crystallization of the quantum well active layer is more satisfactory than that in the case of using a sapphire substrate, and the effect on improving the luminous efficiency by using the above-described Si concentration profiles is made more remarkable.

Note that, in the present example, the barrier layers are composed of two types of layers of the n-type impurity doped layers 701 and the undoped layers 702. However, the same effect can be obtained by changing the concentration by inserting a layer whose concentration varies in a slope form and a layer whose concentration varies step-wise between the two types of layers whose concentrations of the n-type impurities are different from one another.

REFERENCE EXAMPLE 2

In the semiconductor laser shown in reference example 1 and FIG. 13, samples in which the Si doping profiles of the active layer were made as in FIGS. 15($a$), ($c$), and ($e$) were respectively fabricated and evaluated.

EXAMPLE 4

In the present example, a Group III-V nitride light emitting diode having a quantum well active layer on which oxygen was doped was fabricated and evaluated.

Figure 12:
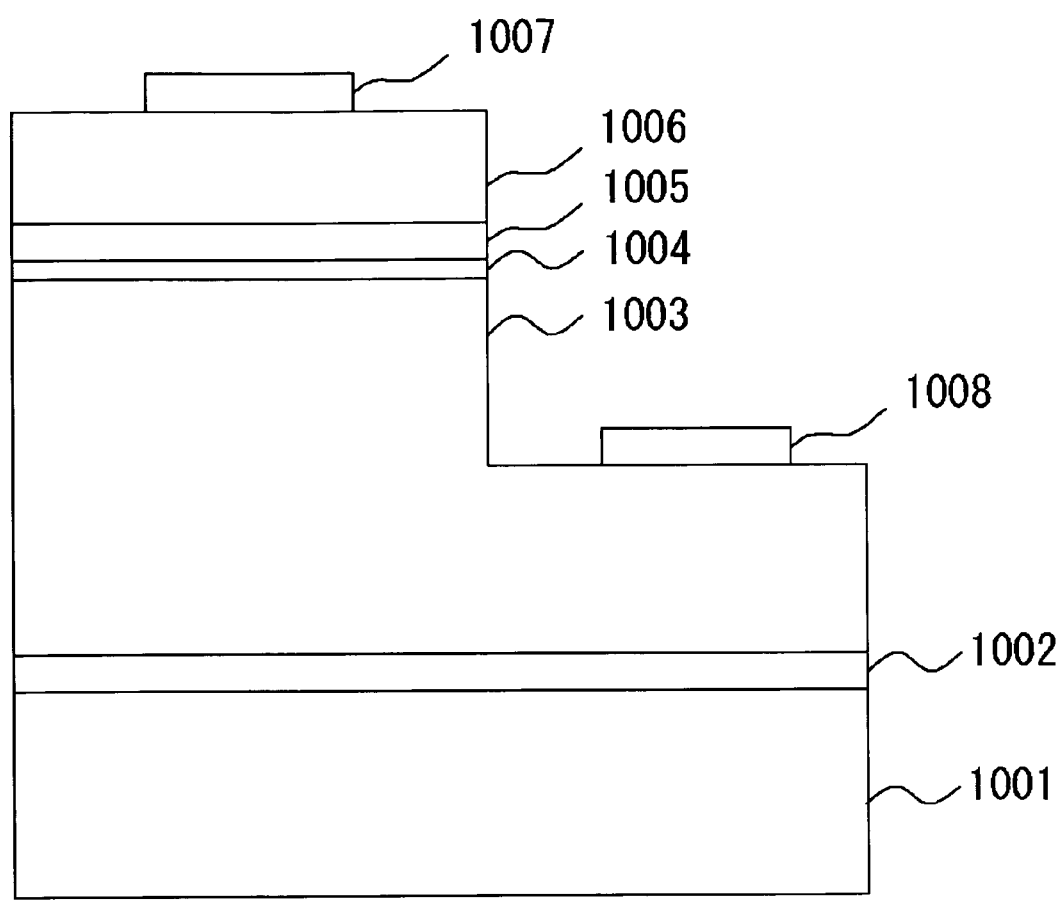
FIG. 12 is a schematic sectional view of a Group III-V nitride semiconductor light emitting diode described in an example 4.

FIG. 12 is a schematic sectional view of a Group III-V nitride light emitting diode relating to the present example. In FIG. 12, on a sapphire substrate 1001 whose thickness is 330 μm with a c plane serving as a surface, a low temperature GaN buffer layer 1002 whose thickness is 100 nm, an n-type GaN contact layer 1003 whose thickness is 4 μm, a quantum well layer 1004 composed of an oxygen doped $In_{0.45}Ga_{0.55}N$ whose thickness is 3 nm, a cap layer 1005 composed of a p-type $Al_{0.2}Ga_{0.8}N$ whose thickness is 100 nm, a p-type GaN contact layer 1006 whose thickness is 0.5 μm, a p-electrode 1007 composed of two-layered metal of Ni/Au, and an n-electrode 1008 composed of two-layered metal of Ti/Al are formed. The n-type GaN contact layer 1003 is exposed by etching, and the n-electrode 1008 is formed on the top surface thereof.

Next, the processes of forming the layer structure of FIG. 12 will be described. A metal organic chemical vapor deposition (hereinafter MOCVD) system) was used for forming the respective semiconductor layers. The growth pressures were set to 100 Torr at all regions of the growths of the semiconductor layers. Further, by using ammonia (hereinafter $NH_3$) as a Group V element precursor, and using trimethylgallium (hereinafter TMG), trimethylaluminum (hereinafter TMA), trimethylindium (hereinafter TMI), bis-ethyl cyclopentadienyl magnesium (hereinafter $(EtCp)_2Mg$), silane diluted to 10 ppm with $H_2$ (hereinafter $SiH_4$), and oxygen ($O_2$) diluted to 20% with $N_2$ as Group III element precursors, and by bubbling with respect to the organic metals with $N_2$ under a pressure of 760 Torr with the respective cylinder temperatures being set to −10 degree centigrade, 20 degree centigrade, 30 degree centigrade, and 30 degree centigrade, the saturated vapors were supplied into a reactor. First, the sapphire substrate 1001 with the c plane serving as the surface was installed in the reactor, and cleaning of the substrate surface was carried out by being heated to 1100 degree centigrade under the hydrogen atmosphere. Next, the low temperature GaN buffer layer 1002 of 100 nm was formed on the sapphire substrate 1001, with the substrate temperature being set to 500 degree centigrade, by supplying TMG at 5 sccm and $NH_3$ at 10 slm. Next, the supply of TMG was stopped, and the substrate temperature was set to 1100 degree centigrade. Next, the n-type GaN contact layer 1003 whose thickness is 4 µm was formed on the substrate by supplying TMG at 15 sccm, and $SiH_4$ at 5 sccm and $NH_3$ at 10 µm serving as dopants. Next, the $In_{0.2}Ga_{0.8}N$ quantum well layer 1004 whose thickness is 3 nm was formed on the substrate while maintaining the temperature of the sapphire substrate 1001 at 800 degree centigrade, by supplying TMG at 10 sccm, TMI at 50 sccm, or 30 sccm, $O_2$ at 20 sccm, and $NH_3$ at 10 slm.

The p-type $Al_{0.2}Ga_{0.8}N$ cap layer 1005 whose thickness is 100 nm was formed by supplying TMG at 15 sccm, TMA at 5 sccm, and $(EtCp)2Mg$ at 5 sccm and $NH_3$ at 10 µm as impurities onto the quantum well layer 1004 formed in this way. Next, the p-type GaN contact layer 1006 whose thickness is 0.05 µm was formed on the sapphire substrate by supplying TMG at 15 sccm, $(EtCp)_2Mg$ at 5 sccm, and $NH_3$ at 10 slm, with the temperature of the substrate 1001 being maintained at 1100 degree centigrade. Thereafter, the substrate 1001 was taken out of the deposition apparatus, and the p-electrode 1007 composed of two-layered metal of Ni/Au was formed by vacuum evaporation. Further, the n-type GaN contact layer 1003 was exposed by etching, and the n-electrode 1008 composed of two-layered metal of Ti/Al was formed by vacuum evaporation on the top surface thereof. Finally, the device was obtained by cutting the wafer into 350 µm square. When the performance with respect to the light emitting diode of the present example was evaluated, satisfactory luminous intensity and radiation lifetime were obtained.

REFERENCE EXAMPLE 4

In the present example, a semiconductor laser was fabricate and evaluated in the same way as in the example 2 except that a quantum well structure on which oxygen doping was carried out was fabricated not by using an oxygen gas but by using an ammonia gas containing $H_2O$. The $H_2O$ content in the ammonia was set to 15 ppm by weight.

When the obtained quantum well active layer of the semiconductor laser was analyzed by a SIMS, the maximum value of the oxygen concentration was over ten times as many as the minimum value of the oxygen concentration. Further, the luminous intensity of the semiconductor laser in the present example was less than or equal to 10 a.u.

EXAMPLE 5

The present example relates to an active layer of a quantum well structure on which sulfur (S) has been doped. The layer structure relating to the present example is a layer structure which is the same as that described in FIG. 1 of the example 1 except that the type of doping is different. Namely, a semiconductor multilayer film of a quantum well structure is provided above an undoped GaN layer 1301 formed on a sapphire substrate 1300, and a protective film 1304 is formed above it. Both of the barrier layers 1302 and the well layers 1303 constituting the quantum well are composed of InGaN, and sulfur (S) has been doped in those. Sulfur (S) doping is carried out by introducing hydrogen sulfide ($H_2S$) diluted with hydrogen ($H_2$) in a film-forming chamber at the time of growing the barrier layers and the well layers.

In the case of using sulfur, in the same way as in the case of using oxygen, it is possible to control the carrier concentration in proportion with the molar flow rate. However, in the same way as oxygen doping, the doping efficiency is lower than that of silicon doping, and the dependency on a carrier concentration with respect to the mobility is remarkable as compared with silicon doping. Accordingly, it is not easy to control the characteristic of the quantum well layer. Moreover, in the same way as oxygen doping, approximate ½0 of the impurities which have been doped generate carriers.

In addition thereto, a doping amount of sulfur has, in the same way as in the case of oxygen, the strong dependency on a temperature, and only the sulfur whose concentration is extremely low is doped in the growth at a high-temperature. Further, when a temperature is too low, the crystallization is deteriorated due to sulfur being fetched too much, and the carrier density is reduced. Accordingly, in a case of doping sulfur, in the same way as the case of oxygen, the doping conditions for doping at a concentration enough to be able to improve the characteristic of a light emitting device are within an extremely narrow range.

In the case of sulfur as well, by setting the concentration range per quantum well as a carrier concentration (sheet concentration) which is greater than or equal to $0.6 \times 10^{12}$ $cm^{-2}$ and less than or equal to $7 \times 10^{12}$ $cm^{-2}$, and an element concentration (sheet concentration) which is greater than or equal to $1.3 \times 10^{13}$ $cm^{-2}$ and less than or equal to $14 \times 10^{13}$ $cm^{-2}$, a satisfactory PL characteristic can be stably obtained. Note that the PL characteristic of a quantum well structure is basically not influenced by anything but the other layer structures. Accordingly, the above-described contents are applied in the same way to various semiconductor lasers, light emitting diodes, and the like which have similar quantum well structures.

The above-described example used the sapphire substrate. However, by using a low dislocation GaN substrate (whose surface dislocation density is less than or equal to $10^{17}$) obtained by the FIELO method described above as well, in the same way as described above, a structure showing an excellent PL characteristic can be obtained.

The contents of the present invention were described above in detail on the basis of the examples. With respect to those, the maximum value of the concentrations of the impurities doped in the light emitting layers is made less than or equal to five times as many as the minimum value, and an excellent luminescence characteristic can be obtained.

What is claimed is:

1. A method of manufacturing a semiconductor light emitting device, comprising:

forming a light emitting layer composed of a Group III nitride semiconductors on a substrate by a vapor phase deposition method, by using a doping gas containing an element in Periodic Table Group 6B, and a mixed gas including a Group III precursor gas and a nitrogen source gas, wherein a molar flow rate of the doping gas is made excessive more than a molar flow rate of the Group III precursor gas;

wherein the step of forming said light emitting layer is executed after forming Group III nitride semiconductor layers containing an element in Periodic Table Group 4B as an impurity on said substrate by a vapor phase deposition method; and wherein after forming Group III nitride semiconductor layers containing an element in Periodic Table Group 4B as an impurity, a film-forming gas used for forming the Group III nitride semiconductor layers is purged, and next, said light emitting layer is formed.

2. The method of manufacturing a semiconductor light emitting device according to claim 1, wherein the element in Periodic Table Group 6B is O or S.

3. A method of manufacturing a semiconductor light emitting device, comprising:

forming a light emitting layer composed of a Group III nitride semiconductors on a substrate by a vapor phase deposition method, by using a doping gas containing an element in Periodic Table Group 6B, and a mixed gas including a Group III precursor gas and a nitrogen source gas, wherein a molar flow rate of the doping gas is made excessive more than a molar flow rate of the Group III precursor gas, and wherein said light emitting layer has a quantum well structure, the step of forming said light emitting layer includes a step of forming well layers and barrier layers alternately, and said doping gas is introduced at the time of forming said barrier layers.

4. The method of manufacturing a semiconductor light emitting device according to claim 3, wherein the element in Periodic Table Group 6B is O or S.

* * * * *